US012196795B2

(12) United States Patent
Chou et al.

(10) Patent No.: US 12,196,795 B2
(45) Date of Patent: Jan. 14, 2025

(54) CALIBRATION AND GROUP TESTING SYSTEM FOR RADIO FREQUENCY UNITS AND METHOD THEREFOR

(71) Applicant: OHMPLUS TECHNOLOGY INC., New Taipei (TW)

(72) Inventors: Hsi-Tseng Chou, New Taipei (TW); Jake Waldvogel Liu, New Taipei (TW)

(73) Assignee: Ohmplus Technology Inc., New Taipei (TW)

( * ) Notice: Subject to any disclaimer, the term of this patent is extended or adjusted under 35 U.S.C. 154(b) by 225 days.

(21) Appl. No.: 18/059,136

(22) Filed: Nov. 28, 2022

(65) Prior Publication Data

US 2023/0168289 A1    Jun. 1, 2023

Related U.S. Application Data

(60) Provisional application No. 63/284,727, filed on Dec. 1, 2021.

(51) Int. Cl.
*G01R 29/08* (2006.01)
*H04B 17/11* (2015.01)
*H04B 17/21* (2015.01)

(52) U.S. Cl.
CPC ......... *G01R 29/0878* (2013.01); *G01R 29/08* (2013.01); *H04B 17/11* (2015.01); *H04B 17/21* (2015.01)

(58) Field of Classification Search
CPC .... G01R 29/0878; G01R 29/08; H04B 17/11; H04B 17/21
See application file for complete search history.

(56) References Cited

U.S. PATENT DOCUMENTS

| 7,167,133 B2 * | 1/2007 | Nagashima ............ G01R 29/10 343/703 |
| 9,678,126 B2 * | 6/2017 | Huynh ............... H04B 17/3911 |
| 2017/0279544 A1 * | 9/2017 | Noda ................... H04B 17/318 |

FOREIGN PATENT DOCUMENTS

TW    I739181 B    9/2021

OTHER PUBLICATIONS

First Examination Report mailed to Corresponding Japanese Patent Application No. 2022-187906 dated Apr. 16, 2024.
(Continued)

*Primary Examiner* — Hai V Tran
(74) *Attorney, Agent, or Firm* — Rosenberg, Klein & Lee

(57) ABSTRACT

A calibration and group testing system for RF units and a method therefor are provided. The system includes a control device, a signal source device, a test platform, and a measurement device. M times of measurements are performed between the test platform and the measurement device. For each measurement, a microwave signal source is converted into random microwave signals with N random amplitudes and phases, and the RF units are respectively stimulated to output the random microwave signals superimposed on a measured path to form a measurement signal. The measurement device receives measurement signals of the M times of measurements and converts them into M pieces of measurement information, respectively. The control device solves the measurement information and performs iterative and convergent calculations on all solution results to obtain calibration information of the RF units in a specific state, thereby correcting the RF units according to the calibration information.

18 Claims, 24 Drawing Sheets

(56) References Cited

OTHER PUBLICATIONS

English Translation of First Examination Report mailed to Corresponding Japanese Patent Application No. 2022-187906 dated Apr. 16, 2024.
Keiji Tatsumi; Masao Fukushima, "Backpropagation as a Successive Projection Method", Transactions of the Institute of Systems, Control and Information Engineers, May 15, 1995, vol. 8, No. 5, pp. 204-211, https://doi.org/10.5687/iscie.8.204.

* cited by examiner

CALIBRATION AND GROUP TESTING SYSTEM FOR RADIO FREQUENCY UNITS AND METHOD THEREFOR

This application claims priority of U.S. Provisional Application No. 63/284,727 filed on 1 Dec. 2021 under 35 U.S.C. § 119(e); the entire contents of all of which are hereby incorporated by reference.

BACKGROUND OF THE INVENTION

Field of the Invention

The invention relates to a calibration system and a method therefor, in particular, to a calibration and group testing system for radio frequency units and method for obtaining calibration information in a certain stimulated state of the RF unit in extreme situations where the measurement information obtained by the RF unit is lack of phase information and only has power or amplitude information.

Description of the Prior Art

High-frequency wireless communication requires an antenna array to increase gain, thereby compensating for losses due to electromagnetic propagation. The active antenna unit consists of an antenna and an RF transceiver module. By adjusting the amplitude and the phase outputted by the RF transceiver module, the antenna can be stimulated to generate the radiation beam. Since the inaccuracy of the measured antenna radiation pattern and the simulated antenna radiation pattern may come from the antenna, the active RF module, and the error and malfunction in the antenna manufacturing, we need to verify whether the antenna and the RF module function properly, and to correct the error caused by the antenna radiation the RF module outputting in order to obtain a good antenna radiation pattern. In addition, the inaccuracy of the measured antenna radiation pattern and the simulated antenna radiation pattern may also come from the manufacturing defects of the antenna elements themselves (including RF transceiver and radiation modules, such as millimeter-wave antennas made of microstrips), which causes the possible failure or malfunction of the antenna elements (particularly the failure of active transceiver module), and causes the measured antenna radiation pattern to be inaccurate. Such a problem especially occurs when the antenna element is an array antenna. The array antenna is composed of multiple sub-array antenna units; for example, there may be a large number of antenna elements in the Antenna-in-Package (AiP), and the failure or malfunction of any antenna unit will make the measured antenna radiation pattern inaccurate.

Further, the radiation beam of the phased array antenna is generated by a beamforming network (BFN); the phased array antenna includes active RF transceiver elements and phase shifters for stimulating the antenna array. The frequency band applied by the beamforming network has an increasing trend. Therefore, the beamforming network is prone to incur phase errors and cause beam defects, so a complicated and procedural method is required to correct the phased array antenna. The antenna calibration is achieved by adjusting the output amplitude and the output phase of the RF transceiver module. Therefore, in Taiwan Invention Patent No. I739181B (name of invention: Correction Method for Phased Array Antenna, hereinafter referred to as the patent prior art) previously applied by the inventor, the far-field radiation data and the stimulation data of the antenna element are used to satisfy Discrete Fourier Transformation Formula. Thus, Discrete Fourier Transformation Formula can be used to correct the antenna array, so that the co-polarized far-field radiation source has equal phase and amplitude in the boresight direction, whereby the digital phase shifter stores the error-corrected phase as a reference value for scanning the beam.

As an embodiment, the patent prior art corrects the error of the phase and amplitude of the antenna based on vertical orthogonal signal and Discrete Fourier Transformation Matrix. However, the process requires complicated calculation equation. In particular, in the case that the measurement signal is non-vertically orthogonal, the equipment needs to measure both the power (i.e., amplitude information) and the phase of the radiated electromagnetic field of the antenna, and the equipment such as vector network analyzer is very expensive, becoming a major burden for production lines. Therefore, it is necessary to be able to obtain the phase error information and amplitude information of the antenna in a relatively simple solution way, which can be used as the preparation and calibration information before the signal verification, can check which of the antenna elements has a failure or malfunction, and can establish BFN stimulation amplitude and phase tables.

SUMMARY OF THE INVENTION

In view of the cost problems in the prior art, an objective of the invention is to stimulate each antenna element to radiate electromagnetic waves by different and random phase and amplitude signals, to perform measurement and analysis of the radiation power by a power meter, and then, to obtain the amplitude information and phase difference information of the antenna element for further use in subsequent antenna calibration by performing iteration and convergence on the measurement results. The invention is also applicable to extreme measurement situations as follows: where the measurement information has amplitude difference information and phase difference information for calibration solution; where the measurement signal is in a non-vertical quadrature relationship for fast calibration; or where only power information or amplitude information is used while lacking phase information. The invention is also applicable to the testing of group antenna package modules or group RF modules.

According to the objective of the invention, a calibration and group measurement system for radio frequency (RF) units, comprising a control device; a signal source device, connected with the control device, the signal source device outputting a microwave signal source according to signal source information emitted by the control device; a test platform, connected with the control device and the signal source device, the test platform being provided to place N RF units and performing M times of stimulations, wherein during each of the stimulation, the test platform transforms the microwave signal source into N random microwave signals, the RF units respectively output n random microwave signals, and the random microwave signals being superimposed to form a measurement signal; and a measurement device, connected with the control device, wherein the measurement device receives M times of the measurement signal to generate M pieces of measurement information respectively, and the measurement device transmits the M pieces of measurement information to the control device; the control device solves the signal according to the M times of the M pieces of measurement information and the M times of the N random microwave signals, and performs iterative and convergence calculation on all solution results to obtain amplitude information and phase difference information of the RF units; wherein the N and the M are positive integer.

In summary, without any phase information, the invention can achieve signal solution through the measurement information and the random microwave signal, perform iteration and convergence calculation on all of the solution results to obtain the amplitude information and phase difference information of each of the antenna elements to be tested for prepared calibration information before the verification of the signals. The invention can also check which RF unit or individual RF unit of the antenna elements has a defective or faulty antenna element. Moreover, requiring no phase information means that the invention only requires a single signal source device to measure at least one RF unit, thereby reducing the measurement cost.

DESCRIPTION OF THE PREFERRED EMBODIMENTS

Figure 1:
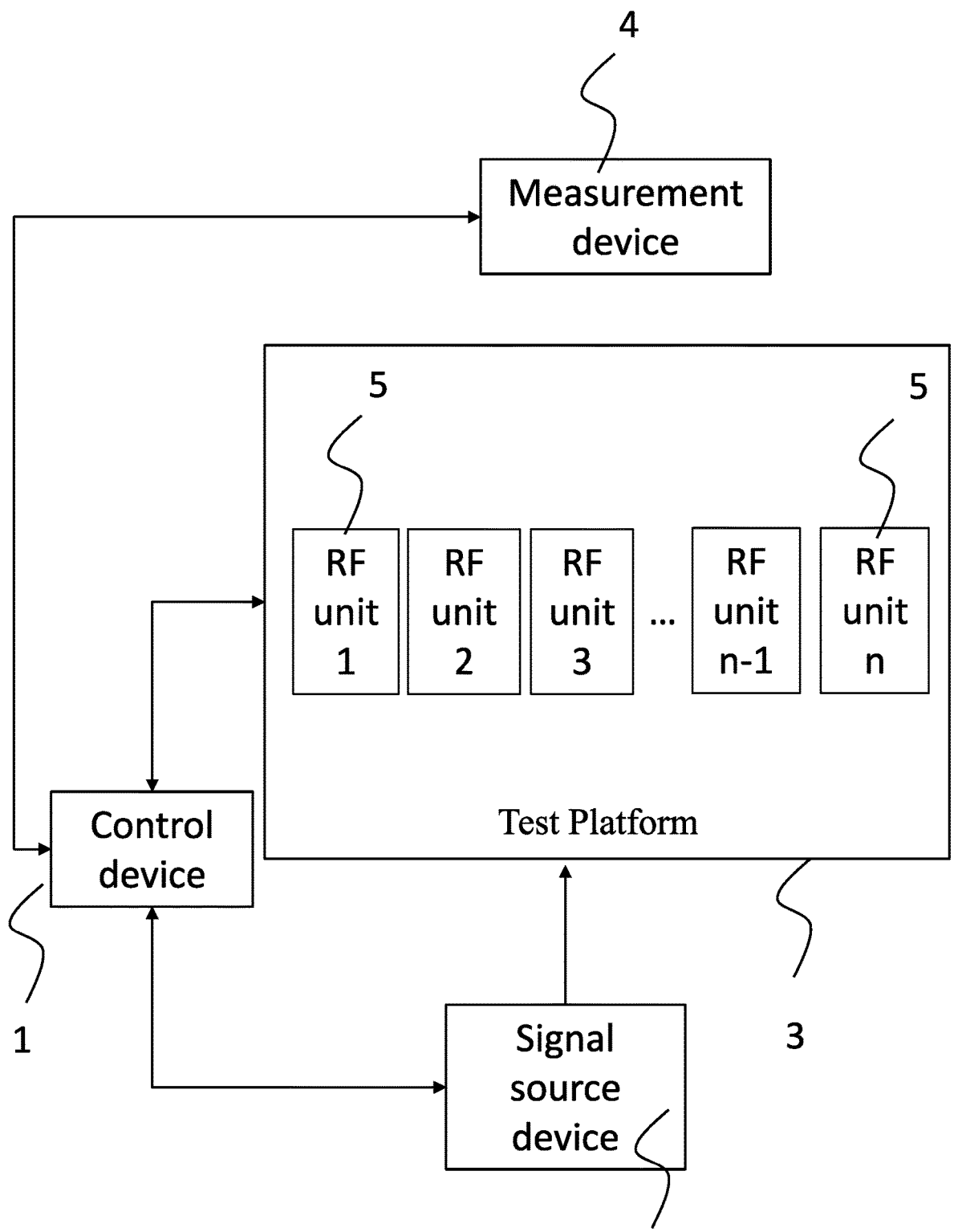
FIG. 1 is a schematic diagram according to the system architecture of the invention.

Embodiments of the invention will be further explained with the help of the related drawings below. Wherever possible, in the drawings and the description, the same reference numbers refer to the same or similar components. In the drawings, shapes and thicknesses may be exaggerated for simplicity and convenience. It should be understood that the elements not particularly shown in the drawings or described in the specification have forms known to those skilled in the art. Those skilled in the art can make various changes and modifications based on the content of the invention.

With reference to FIG. 1, the invention provides a calibration and group testing system, which includes a control device 1, a signal source device 2, a test platform 3 and a measurement device 4. The control device 1 is connected with the signal source device 2, the test platform 3 and the measurement device 4; the control device 1 provides control information to the signal source device 2 and the test platform 3; the test platform 3 is connected with the signal source device 2; the signal source device 2 provides a microwave signal source to the test platform 3; the test platform 3 is provided to place N RF units 5, and M times of measurements are performed by the test platform 3; during each of the tests, the test platform 3 converts the microwave signal source into N random microwave signals; the test platform 3 transmits the n random microwave signals to the RF units 5 and the control device 1, one of RF units 5 receives one of the random microwave signals respectively, and RF units 5 transmits the random microwave signals received by each.

During each of the tests, the measurement device 4 receives the random microwave signals emitted by the RF units 5. The random microwave signals are superimposed to form a measurement signal in a measurement environment. The measurement device 4 receives M times of the measurement signal to generate M pieces of measurement information respectively. Then, the measurement device 4 transmits the M pieces of measurement information to the control device 1 The control device 1 solves the signal according to the M pieces of measurement information of the M times of measurements and the random microwave signals, and performs iterative and convergence calculation on all solution results to obtain amplitude information and phase difference information of the RF units 5 in a certain stimulation state as a reference for calibration.

In the invention, the RF units 5 may be a radio frequency chip (RFIC), an antenna in package (AiP), or an antenna element, respectively. Also, the antenna element may be a dipole antenna, a monopole antenna, a loop antenna, a planar inverted-F antenna (PIFA), a patch antenna, a microstrip antenna, array antenna, and so on. Further, the antenna in package is formed by combining the radio frequency chip (RFIC) and the antenna element.

When the N RF units 5 are N antennas in package or N antenna elements, the N random microwave signals are radiated into a measurement environment by the N antennas in packages (AiP) or the N antenna elements, and electromagnetic waves formed in the measurement environment are naturally superimposed to form the measurement signal. When the N RF units 5 are the radio frequency chips, and group testing is performed on the radio frequency chips (RFIC), then the antenna does not exist, and the radio frequency chip uses the radio frequency circuit to superimpose the measurement signals through a power combiner.

What needs to be specifically stated here is that the invention only needs a single signal source device to measure more than one RF unit 5, and the test platform 3 is not limited to placing the same RF unit 5; for example, two different RF chips and five patch antennas are placed on the test platform 3, and the antennas connected to the RF chips may also be excited to radiate RF signals into the air; during the measurement, two different RF chips and five patch antennas are considered as the aforementioned N RF elements (or even virtual array antennas) to perform the solution, and obtain them through appropriate measurement information, so that the respective amplitude information and phase difference information of the two RF chips and the five patch antennas may still be obtained.

Further, the invention is derived from the concept of phase array, and may be applied to the group test and correction for multiple antenna elements or multiple antennas in a package, or to the group test for multiple RF chips, or to the group test and correction for mixed antenna elements, antenna array package modules and RF chips. For example, when the test and correction are performed for multiple antenna elements or the antenna array package modules, the measurement information is measured by the RF instrument. When the test and correction are performed for multiple RF chips, the array layout and connection are performed by the RF circuit of the RF chip, and then the measurement information is obtained from the measurement of the RF instrument after combining with the power combiner, so as to test the output characteristics and reliability of antenna elements, antenna package modules or RF transceiver modules.

In summary, under the premise of lacking phase information, the invention only needs power information or amplitude information, i.e., parameters for correcting the RF unit, and does not need to use expensive instruments to obtain the amplitude and phase difference of the radiation field at the same time.

Figure 2:
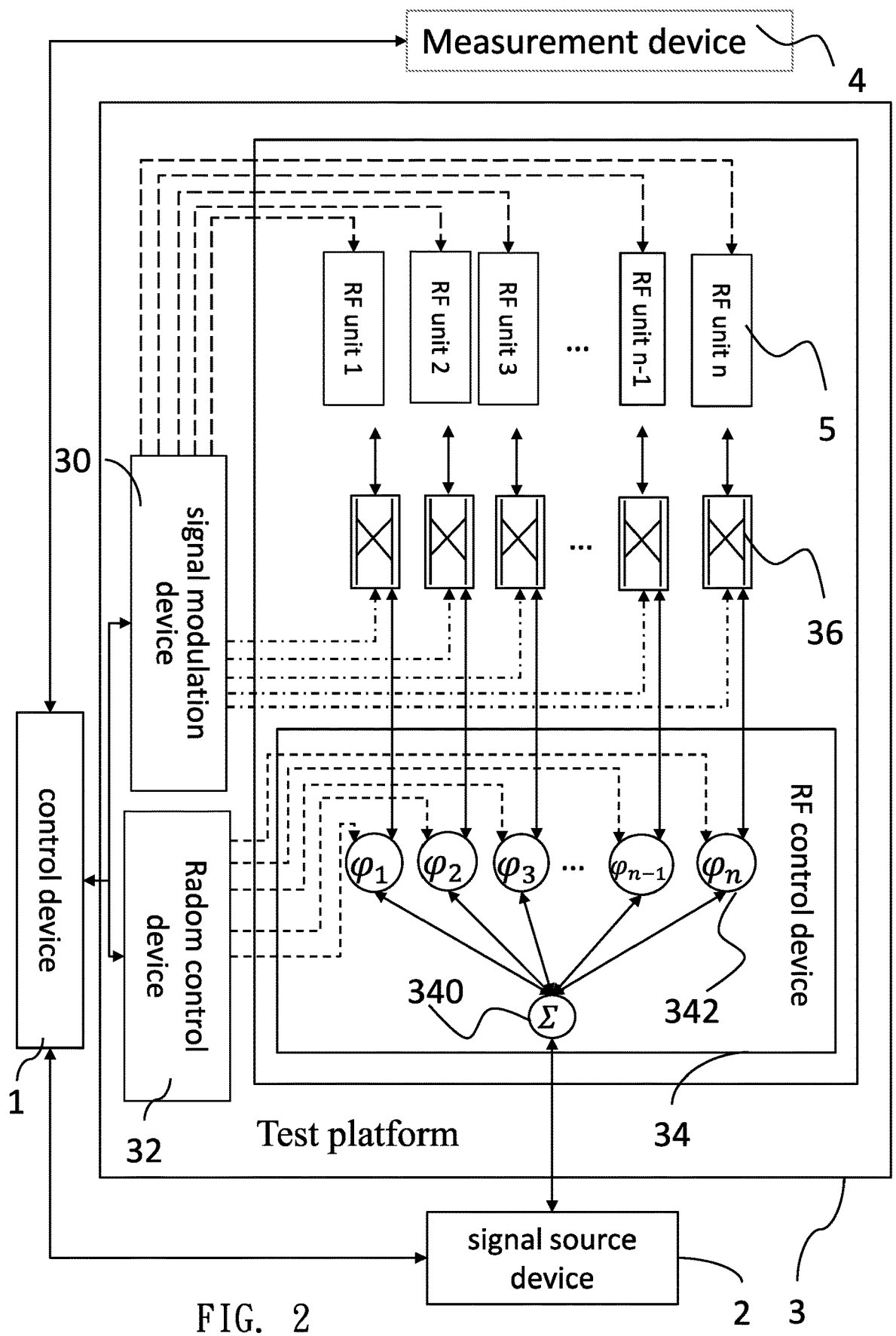
FIG. 2 is a diagram of a test platform according to the invention.

With reference to FIG. 2, the test platform 3 includes a signal modulation device 30, a random control device 32, a radio frequency control device 34, and N coupler 36. The control device 1 is connected with the signal modulation device 30 and the random control device 32. The control device 1 emits modulation information to the signal modulation device 30, and the control device 1 emits a random control signal to the random control device 32. The signal source device 2 is connected with the radio frequency control device 34, and the signal source device 2 outputs a corresponding microwave signal source to the radio frequency control device 34 according to the signal source information emitted by the control device 1. The random control device 32 is connected with the radio frequency control device 34, and the random control device 32 generates random phase and amplitude information to the radio frequency control device 34 according to the random control signal. The radio frequency control device 34 generates RF signals with different phases and amplitudes according to the microwave signal source and the random phase and amplitude information, and the signal modulation device 30 receives modulation information and emits a microwave modulation signal according to the modulation information. The couplers 36 are connected with the radio frequency control device 34 and the signal modulation device 30, and the couplers 36 integrate the RF signals and the microwave modulation signals into the random microwave signals of different phases and amplitudes.

Further, the radio frequency control device 34 may be RFIC and includes a power divider 340 and N digital phase shifters 342, wherein the power divider 340 distributes the microwave signal source to each of the digital phase shifters 342 with the same power level, and the digital phase shifters 342 are connected with the random control device 32 to generate N random phase and amplitude information according to the random control signals of the random control device 32 for further emitting RF signals with different phases from the digital phase shifters 342 respectively. The signal modulation device 30 sends out N microwave modulation signals according to the modulation information, and each of the couplers couples one of the N radio frequency signals and one of the N microwave modulation signals into a random microwave signal so that each of the random microwave signals has its own different phase and amplitude.

In the invention, taking the radio frequency unit as the active array antenna as an example, a relationship between the excitation coefficients of the radio frequency unit (e.g., amplitude, phase and position of the antenna unit) and the radiation is expressed as follows:

$$E_{net}(\vec{r}) = \sum_{n=1}^{N} A_n e^{j\varphi_n} E_n(\vec{r}) \quad (2)$$

In the formula (2), $E_{net}(\vec{r})$ are radiation characteristics of each of the radio frequency units superimposed on the position $\vec{r}$, and $A_n e^{j\varphi_n}$ is the random microwave signal of the n-th radio frequency unit in the m-th time; $A_n$ is the amplitude in each excitation coefficient of the n-th radio frequency unit among the N radio frequency units, $\varphi_n$ is the phase in each excitation coefficient of the n-th radio frequency unit, and the aforementioned excitation coefficients may be adjusted by active elements such as phase shifters, attenuators, and power amplifiers; $\vec{r}=(r,\theta,\phi)$ is the measurement direction and distance. $E_n(\vec{r})$ is the radiated electromagnetic field of the radio frequency unit in the initial state ($(A_n,\varphi_n)=(1,0)$).

In the invention, when the test is performed with the radio frequency unit being the radio frequency chip (RFIC), the antenna does not exist, and the radio frequency chip is obtained by the output of the circuit of the active radio frequency module through the power combiner; then, the abovementioned radiated electromagnetic field is replaced by the current or voltage in the circuit, and the expression of this formula will not be changed.

When the RF unit has an error or is disabled, its changes appear in the changes of $E_n(\vec{r})$, which is replaced by the expression in the brackets of the following formula (3):

$$E_{net}(\vec{r}) = \sum_{n=1}^{N} A_n e^{j\varphi_n} \left( A_n^{err} e^{j\Delta\phi_n^{err}} E_n(\vec{r}) \right) \quad (3)$$

Wherein when the RF unit is the antenna element, $$A_n^{err} e^{j\Delta\phi_n^{err}}$$

in the formula (3) is the error in the radio frequency path to which the antenna element belongs; when the RF unit is the antenna in package, all possible sources, such as active radio frequency modules and transmission lines are further included, which are summarized in this parameter. During the correction procedure, our goal is to find the parameters $$A_n^{err}, e^{j\Delta\phi_n^{err}}, E_n(\vec{r})$$

in the brackets of the above formula (3), because for the array antennas with the same antenna unit type, $E_n(\vec{r})$ the values directly in front of the antenna are the same, while a phase difference will be generated for different antenna units in the non-direct-frontal direction, and the phase difference is included in this parameter and does not affect the correction procedure. For the correction of the antenna elements, the phase difference may be compensated by different excitation coefficients with appropriate weights, so that the antenna obtains the maximum value in the measurement direction. That is to say, after the measurement orientation is determined, the purpose of the correction procedure is to obtain parameters $$A_n^{err}, e^{j\Delta\phi_n^{err}}, E_n(\vec{r}),$$

and the excitation coefficients $(A_n, \varphi_n)$ of the RF unit may be adjusted to obtain the best matching antenna gain. If the parameter value $$A_n^{err}, e^{j\Delta\phi_n^{err}}, E_n(\vec{r})$$

is too small and lower than a normal operating value, it can be judged that the function of the elements in the corresponding radio frequency path is invalid.

In the execution procedure, we first select a measurement orientation $\vec{r}=\vec{r}_{mea}$, and in the measurement orientation, when the M times of measurements are performed by changing $(A_n, \varphi_n)$, the parameters become $(A_n, \varphi_n) \rightarrow (A_{mn}, \varphi_{mn})$. Therefore, the above may be expressed as the following formula:

$$g_m = |f_m| = |[R_{mn}][e_n]| \quad (1)$$

wherein $f_m$ is the measurement information of the m-th time in the M times of measurements, $g_m$ is the amplitude information in the m-th time of the measurements; $R_{mn}$ are the random microwave signals of the n-th antenna of the m-th time (i.e., $A_n e^{j\varphi_n}$), and $[R_{mn}]$ is a vector matrix formed by the above signals; are radiation characteristics $$\left(A_n^{err} e^{j\Delta\phi_n^{err}} E_n(\vec{r})\right)$$

of the n-th radio frequency and the antenna elements in the N antennas, which has nothing to do with the excitation coefficients of the antenna elements, but only with the measurement orientation, the radiation of the RF unit and the error in the radio frequency path. After the measurement information is obtained, it can be used to determine the antenna characteristics in the RF unit, or perform compensation to obtain the correction in the highest antenna gain, or determine the validity and error of the RF unit on the radio frequency path to which the antenna belongs.

When the highest gain of the antenna is used as a reference situation, the parameter values of different output states of the active radio frequency module in each of the RF units may be corrected. Multiple sets of measurement information satisfying the above formula (1) may be obtained by using the solution required for the M-th time of the measurement information. When the M sets of measurement signals have N ranks, the multiple sets of solutions will converge to a single set to satisfy all the measurement information.

Also, formula (2) may be simplified into the following formula, wherein after the factor of the measurement distance r is removed, it becomes a wave function. In terms of the electric field component of the same polarization, its waveform in the direction of $(\theta_0, \phi_0)$ is:

$$F_{co}(\theta_0,\phi_0) = \vec{F}_{net}(\theta_0,\phi_0) \cdot \hat{e} = \sum_{n=1}^{N} A_n e^{j\alpha_n} (\vec{F}_n(\theta_0,\phi_0) \cdot \hat{e}) \quad (2\text{-}1)$$

Wherein $\hat{e}$ is the polarization vector in the co-polarization direction, $A_n$ is the amplitude of the random microwave signal, $\alpha_n$ is the phase of the random phase microwave, $\alpha_n = \Delta_n + \varphi_n$ and $\Delta_n$ is the phase error caused by the channel mismatch of the RF unit 5; $\varphi_n$ are phases generated by the radio frequency control device 34 according to the microwave signal source and the random phase as well as the amplitude information, and the digital shifter in the radio frequency control device 34 generates the random phases according to the random phase and the amplitude information.

Further, for the results of convergence obtained by multiple iterations to solve, successive projection method (SPM) may be used to obtain the solution of the shortest error distance in the form of vertical orthogonal projection for each of the measurement information, i.e., using the solution obtained from the vertical projection of the previous measurement information as the initial excitation coefficient value for the solution of the next measurement information and then performing the solution of the next projection. An iteration calculation formula of each of the solution results is as follows, and the m-th time of the measurement information is used to solve the u-th projection:

$$\vec{e}_{u+1,m} = \vec{e}_{u,m} + \left(\left|\frac{g_m}{\vec{R}_m \cdot \vec{e}_{u,m}}\right| - 1\right) \frac{\vec{R}_m \cdot \vec{e}_{u,m}}{\vec{R}_m \cdot \vec{R}_m^*} \vec{R}_m^* \quad (4)$$

wherein $\vec{e}$ is the vector of $[e_n]$, which is represented by ($\vec{e} = [e1, e2, \ldots]$); u is the number of times of iterations; $\vec{e}_{u,m}$ is the value of the previous iteration; $g_m$ is the amplitude of measurement information $f_m$; $\vec{R}_m$ is the vector representation of $[R_{mn}]$; $\vec{R}_m^*$ is the conjugate vector of $\vec{R}_m$. The iteration sequence is performed sequentially with the measurement information of different orders. After all of the measurement information is used, the previous measurement information may be recycled, because in the iteration process, the error will gradually converge to the minimum value $\vec{e}$, which is the best value satisfying all the measurement information. In the above formula, $f_m$ is the m-th time of the measurement information, which may be in the form of the power formed by the superposition of antenna radiation, or the complex electromagnetic field value including power and phase. Different projections and convergence speeds are produced according to different information provided. That is to say, the invention only needs the power information to obtain the parameters of the antenna correction, and does not need to use expensive instruments to obtain the amplitude and phase of the radiation field at the same time.

In the invention, each of the measurement information measured by the measurement device 4 is represented by the following formula:

$$\text{cost}(u) = \sum_m \left||\vec{R}_m \cdot \vec{e}_{u,m}|^2 - g_m^2\right|; \quad (5)$$

Wherein cost(u) represents the cost function, u represents a first calculation number. The cost difference is according to $\Delta\text{cost} = \text{cost}(u+1) - \text{cost}(u)$. And a calculation number of the cost difference or the cost value currently calculated are used as the convergence conditions.

Figure 3:
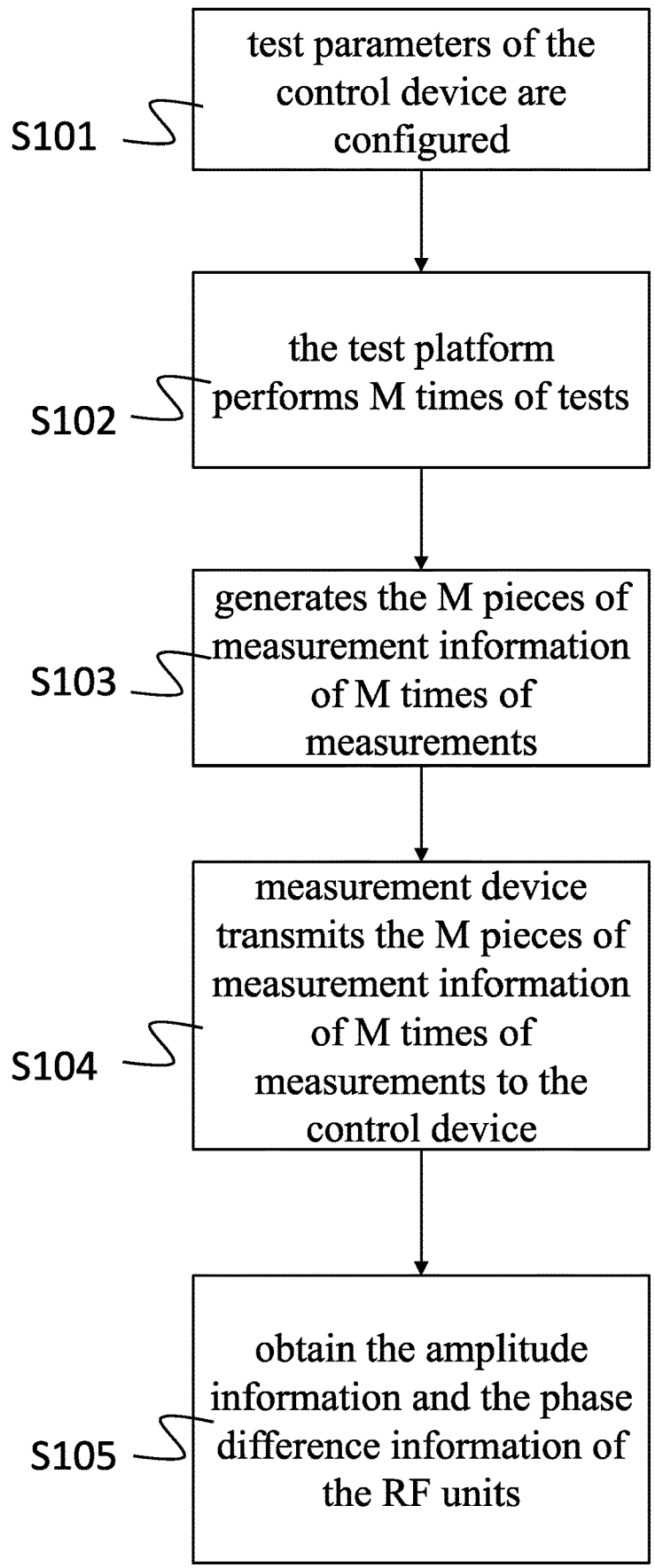
FIG. 3 is a flowchart of a method according to the invention.

With reference to FIG. 3, an calibration and group testing method of the invention includes the following steps.

(S101) test parameters of the control device 1 are configured, the test parameters including the size of the microwave signal source to be output by a test source device configured from the control device 1, the random phase and amplitude information given to the random control device 32, and modulation specifications of the signal modulation device such as AM, FM, PM, pulse modulation and digitally modulated signals such as BPSK, QPSK, QAM, and even spread spectrum signals such as frequency hopping and direct sequence, the modulation signal generator generating the required modulation signal etc. when communications such as GSM, CDMA, Bluetooth (Bluetooth), etc. are tested.

(S102) the test platform 3 performs M times of tests, wherein during each time of the tests, the test platform performs the following steps:

during each of the tests, the test platform converts the microwave signal source into random microwave signals;

the random microwave signals are transmitted to the N RF units 5 and the control device 1;

one of the RF units 5 receives one of the random microwave signals respectively; and the RF units 5 emits the random microwave signals received by each RF units.

(S103) the measurement device 4 receives the random microwave signals emitted from the RF units 5 of the test platform 3 during the m-th time of the tests, and generates the M pieces of measurement information of M times of measurements.

(S104) the measurement device 4 transmits the n pieces of measurement information of m times of measurements to the control device 1.

(S105) the control device solves the signal according to the M pieces of measurement information of the M times of measurements and the random microwave signals, and performing iterative and convergence calculation on all solution results to obtain the amplitude information and the phase difference information of the RF units.

Figure 4:
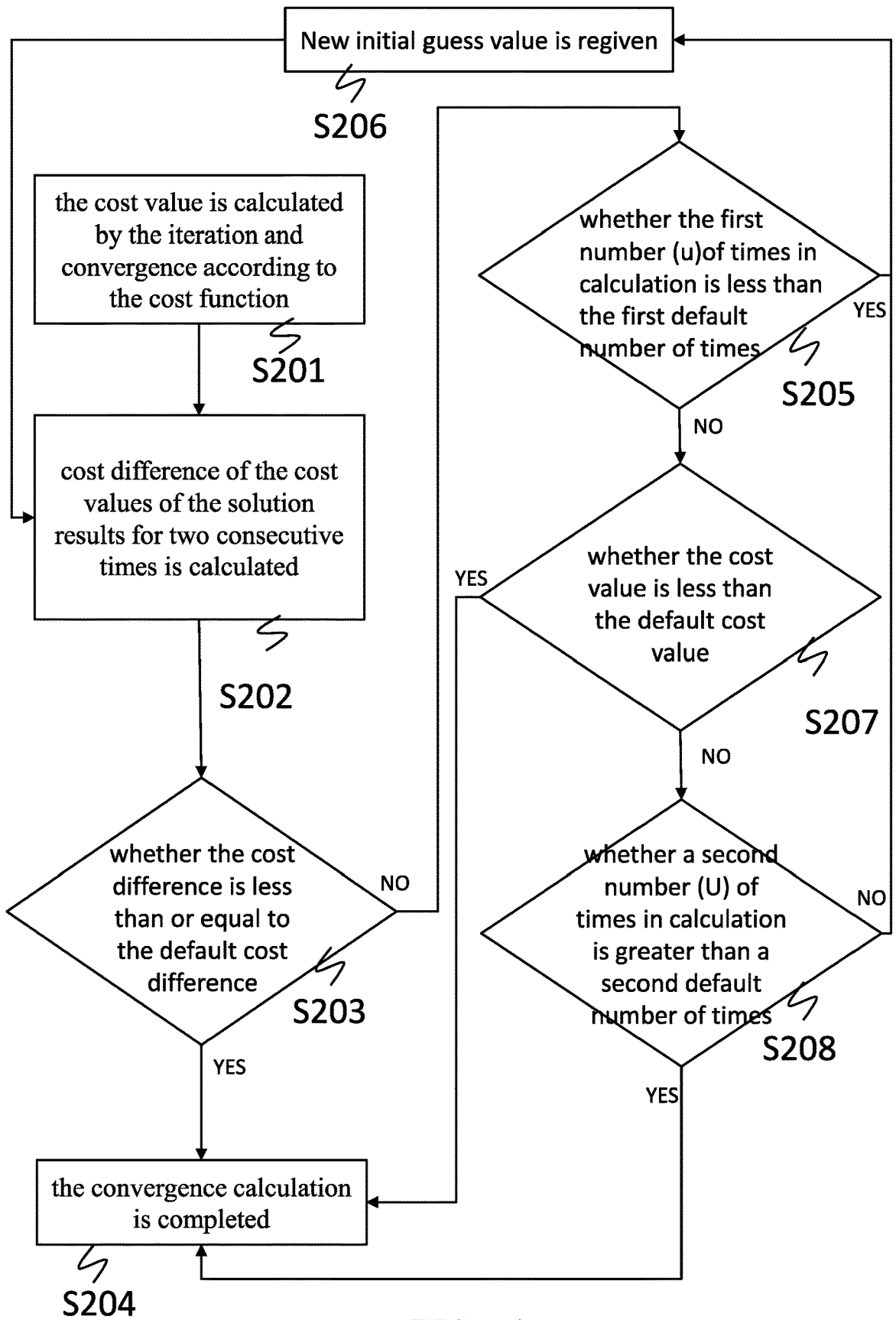
FIG. 4 is a flowchart of measurement and convergence according to the invention.
Figure 5:
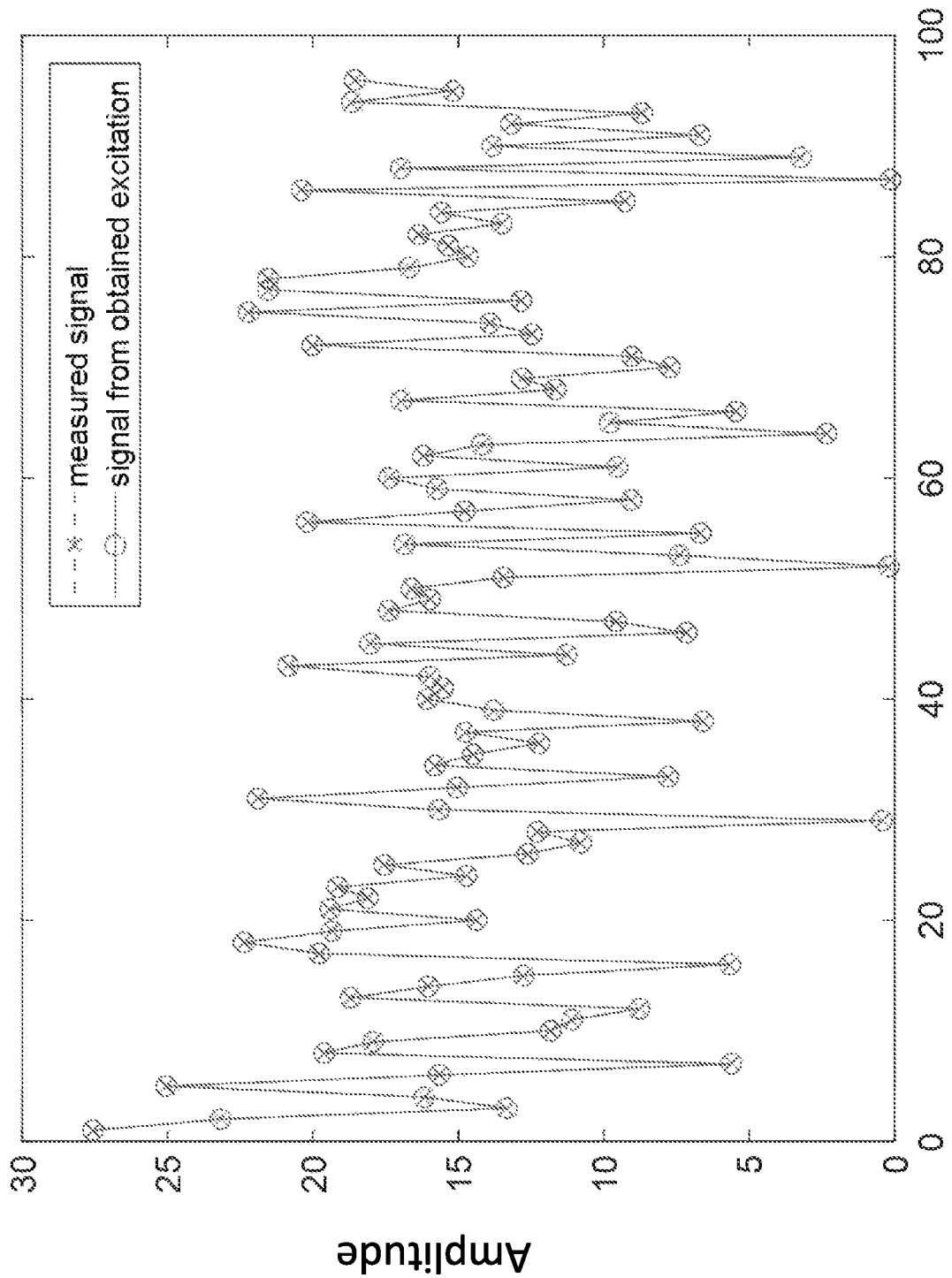
FIGS. 5 to 8 respectively show solution results, iteration convergence, amplitude information, and phase difference information of measurement and simulation according to a first embodiment of the invention.

In the invention, with reference to FIG. 4, the step of performing iteration and convergence on the solution results includes the following steps:

(S201) the iteration and convergence are performed according to the solved results, and the cost value is calculated by the iteration and convergence according to the cost function;

(S202) a cost difference of the cost values of the solution results for two consecutive times is calculated;

(S203) whether the cost difference is less than or equal to the preset cost difference $\varepsilon_1$ is determined, wherein if yes, the method proceeds to step (S204); if not, the method proceeds to step (S205); the preset cost difference is a part of the test parameter configured by the control device 1;

(S204) the convergence is completed;

(S205) whether the first number of times in calculation u is less than the first default number of times $I_1$ is determined; if yes, the method proceeds to step (S206), and if not, the method proceeds to step (S207), wherein the first number of times in calculation u is the number of times of accumulating the cost difference, the first default number of times is a part of the test parameter configured by the control device 1, and the first default number of times is a positive integer;

(S206) a new initial guess value $\vec{e}_{u,m}$ is regiven, and then the step (S201) is performed;

(S207) whether the cost value is less than the preset cost value $\varepsilon_2$ is determined, wherein if yes, the method proceeds to the step (S204); if not, the method proceeds to step (S208); the preset cost value is a part of the test parameter configured by the control device 1, and the preset cost value is a positive integer;

(S208) whether a second number of times in calculation U is greater than a second default number of times $I_2$ is determined, wherein if yes, the method proceeds to the step (S204); if not, the method proceeds to the step (S206); the second number of times in calculation is the number of times of regiving the new initial guess value $\vec{e}_{u,m}$ accumulatively, the second default number of times is a part of the test parameter configured by the control device, and the second default number of times is a positive integer.

In summary, the definition of the convergence condition includes the following:

1. indicating the completion of the convergence when the cost difference $\Delta$cost is less than or equal to a preset cost difference $\varepsilon_1$;
2. also indicating the completion of the convergence under the condition that the cost difference $\Delta$cost is calculated to be greater than the preset cost difference $\varepsilon_1$, the first number of times in calculation u is also greater than the first default number of times $I_1$ and the cost value cost of the current calculation is less than the preset cost value $\varepsilon_2$;
3. indicating the completion of the convergence under the condition that the cost difference $\Delta$cost is calculated to be greater than the preset cost difference $\varepsilon_1$, the first number of times in calculation u is also greater than the first default number of times $I_1$, the cost value cost of the current calculation is greater than the preset cost value $\varepsilon_2$ and a second number of times in calculation U is greater than a second default number of times $I_2$.
4. When the first number of times in calculation u is less than the first default number of times $I_1$, or when the second number of times in calculation U is less than the second default number of times $I_2$, the new $\vec{e}_{u,m}$ may be regiven, and the cost value and the cost difference may be re-calculated.

In the invention, M is greater than N; M may also be greater than or equal to three times N, so that better solution results where the rank of the measurement information is as great as possible may be obtained.

Figure 6:
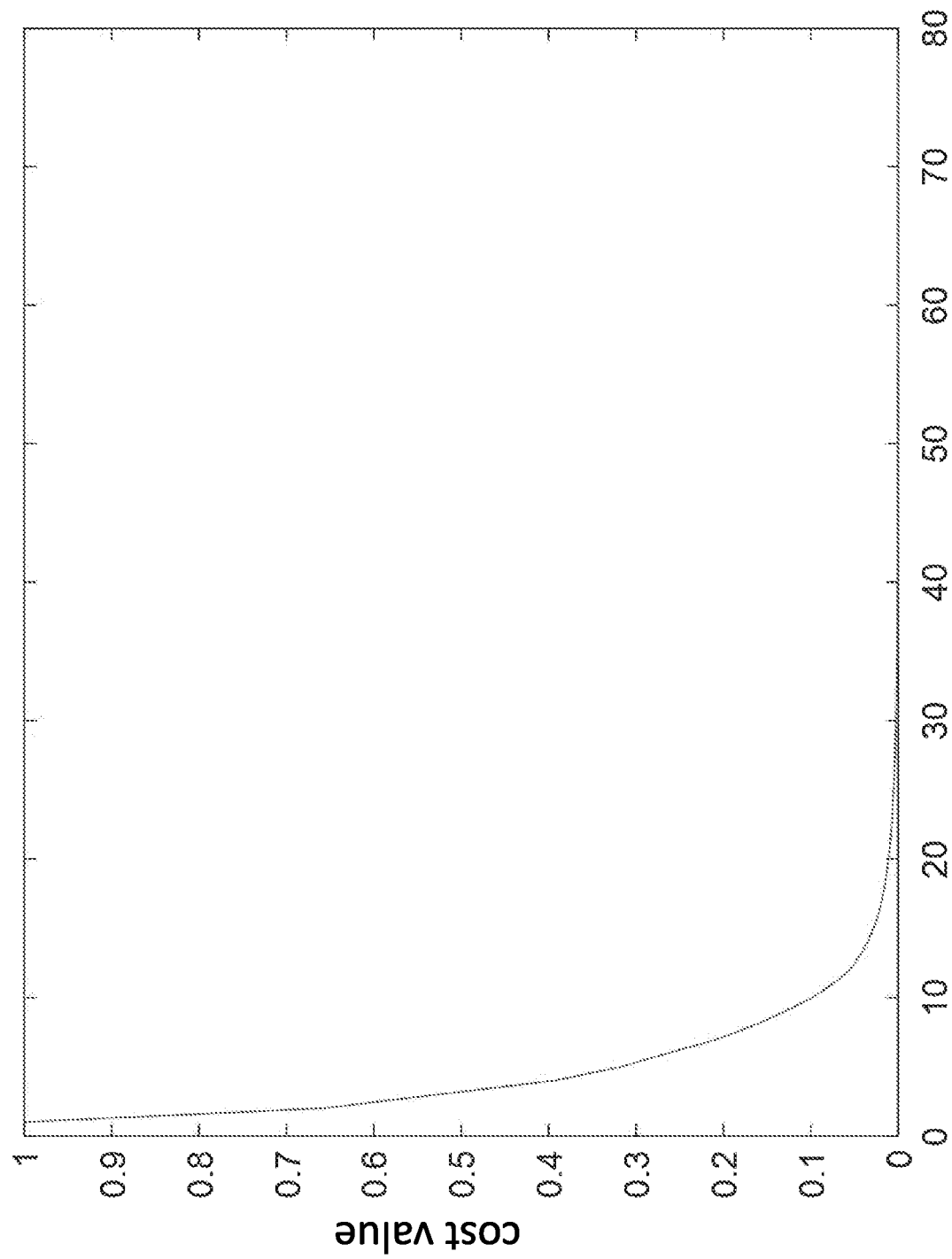
Figure 7:
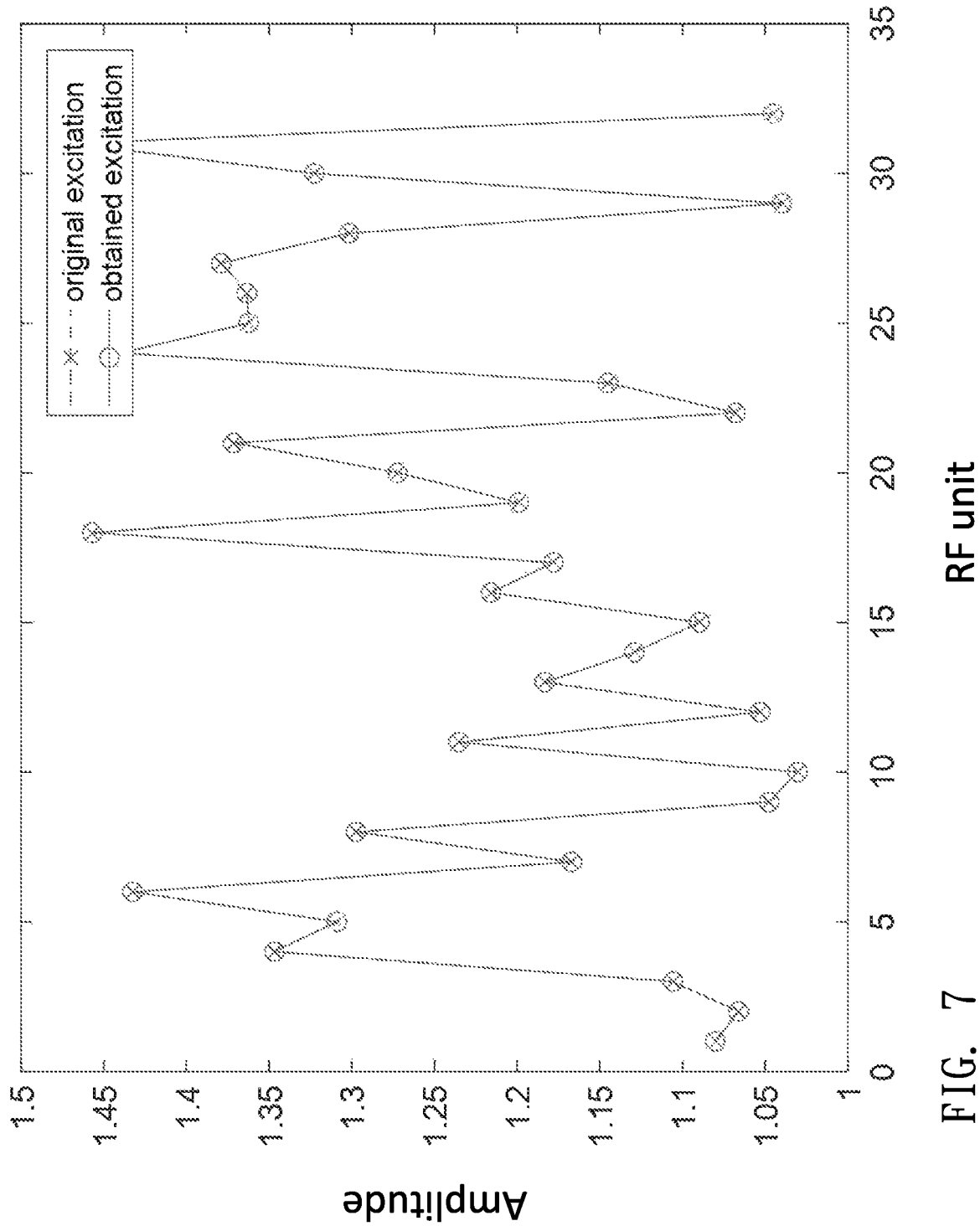
Figure 8:
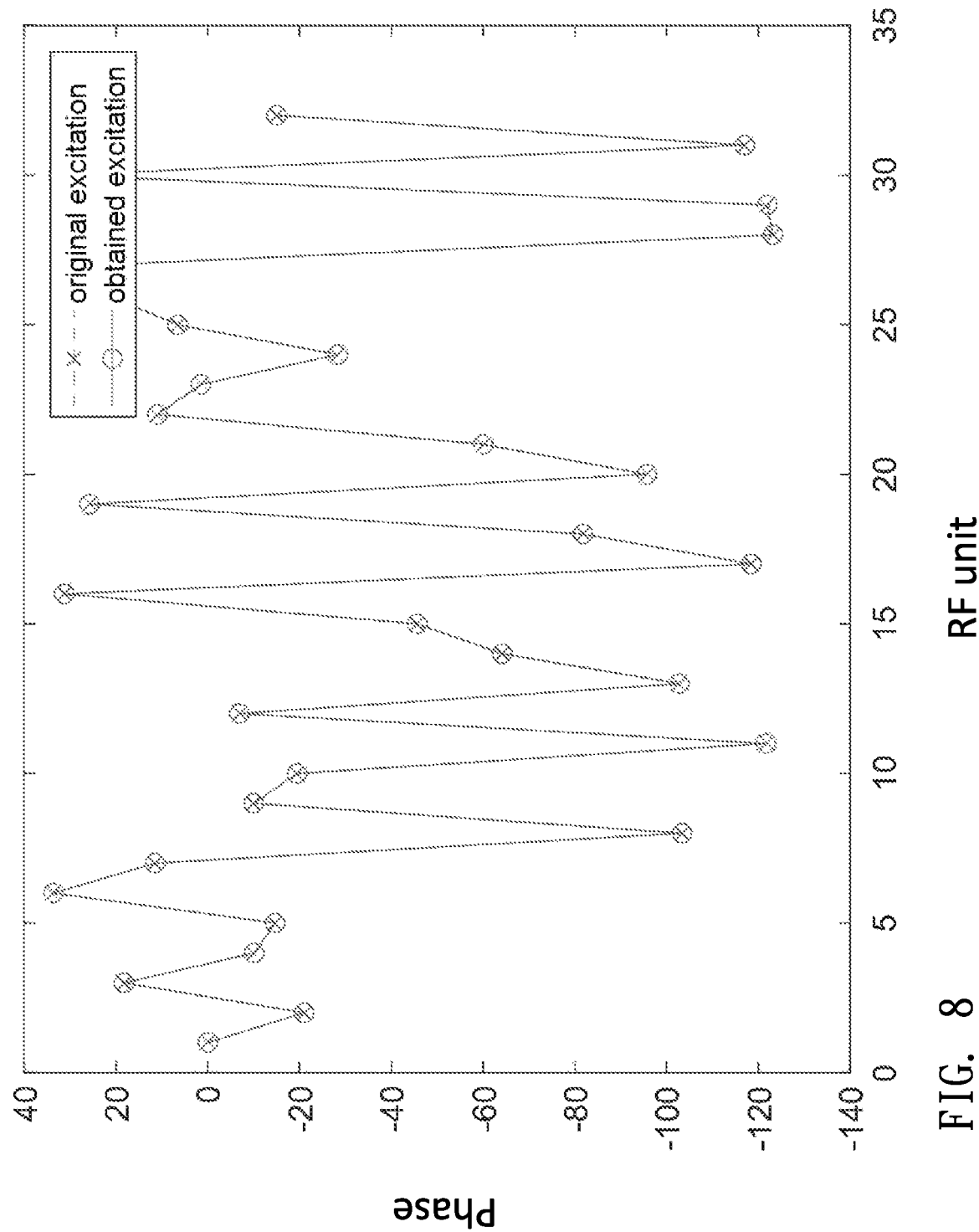
Figure 9:
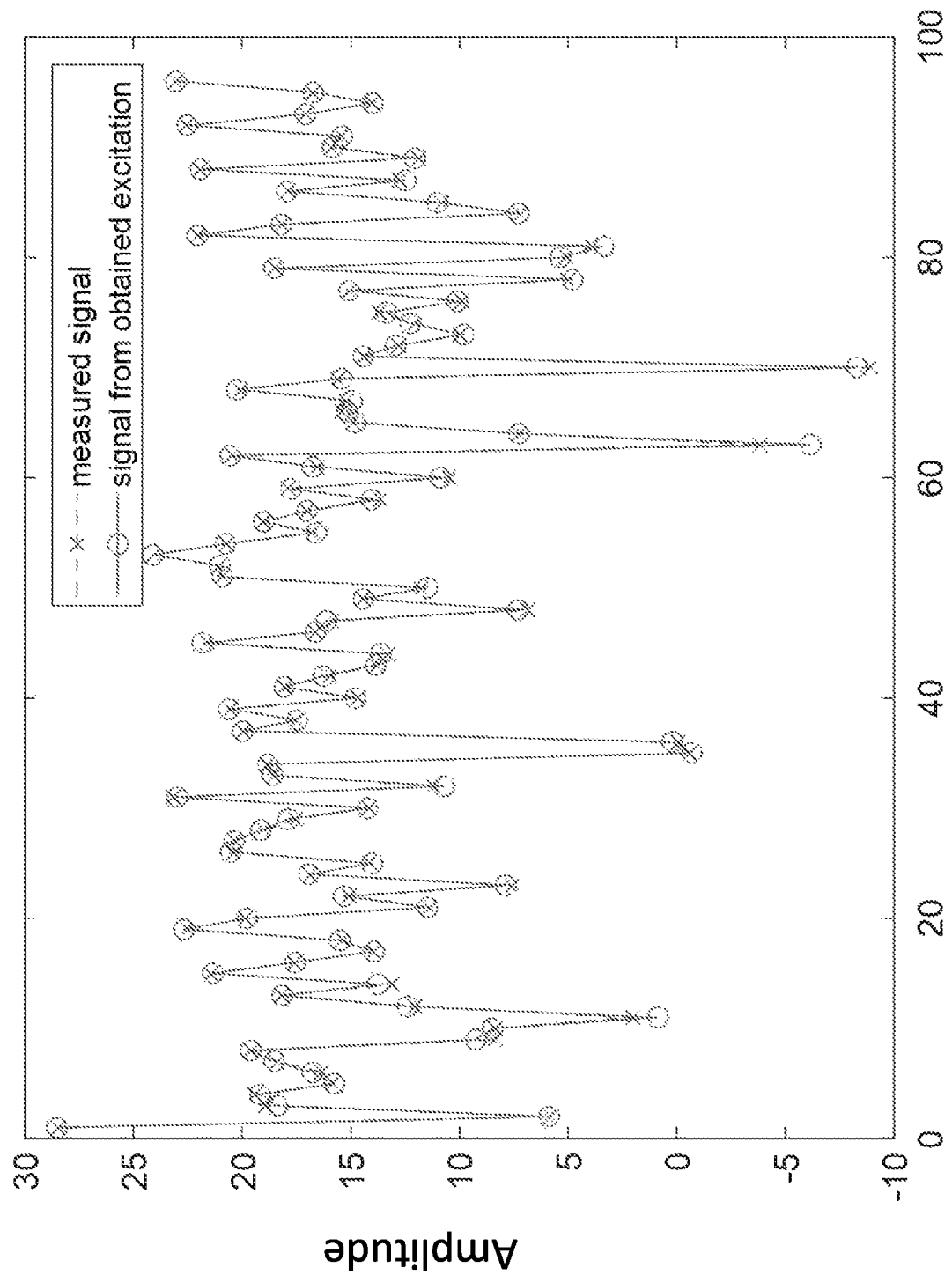
FIGS. 9 to 12 respectively show solution results, iteration convergence, amplitude information, and phase difference information of measurement and simulation according to a second embodiment of the invention.

In order to further understand the solution results, the iteration convergence, the amplitude information, and the phase difference information of the invention, five embodiments are given below for illustration:

In a first embodiment, the number of the RF units 5 is 32, the number of times of measurement is 96, and a 3-bit digital phase shifter is used. With reference to FIGS. 5 to 8, FIG. 5 shows the solution results of each time of simulation and measurement represented by the amplitude, FIG. 6 shows the number of times of calculating the cost and the iteration where it can be seen that the convergence is completed after about the 20th time, FIG. 7 shows the amplitude information of simulation and measurement for each of the RF units 5, and FIG. 8 shows the phase difference information simulated and measured for each of the RF units 5. From FIG. 7 and FIG. 8, the measured amplitude information and the amplitude information of original test may be observed, and the trend of the measured phase difference information and the phase difference information of the simulation test tends to be consistent, indicating that the amplitude information and phase difference information of this time are correct results.

Figure 10:
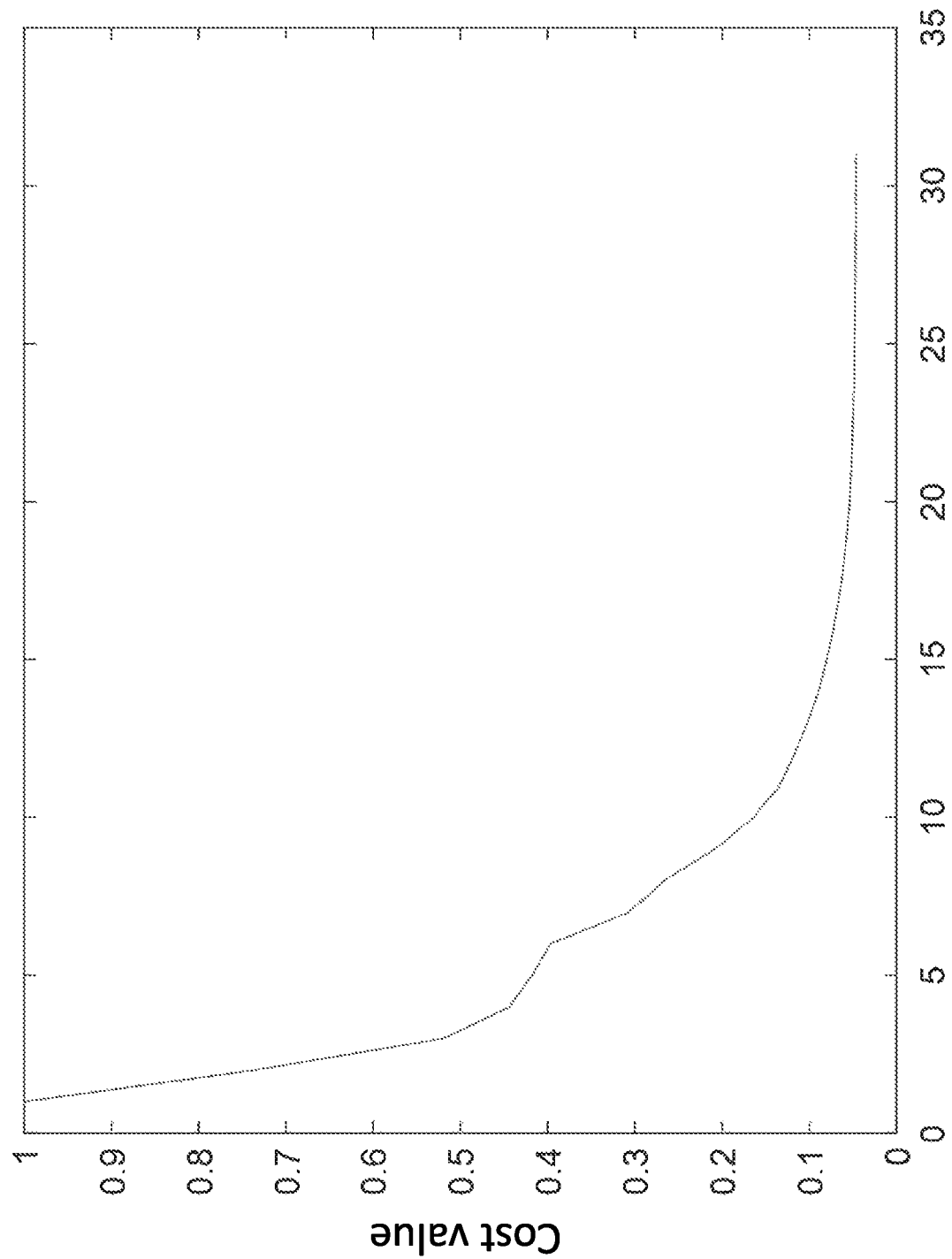
Figure 11:
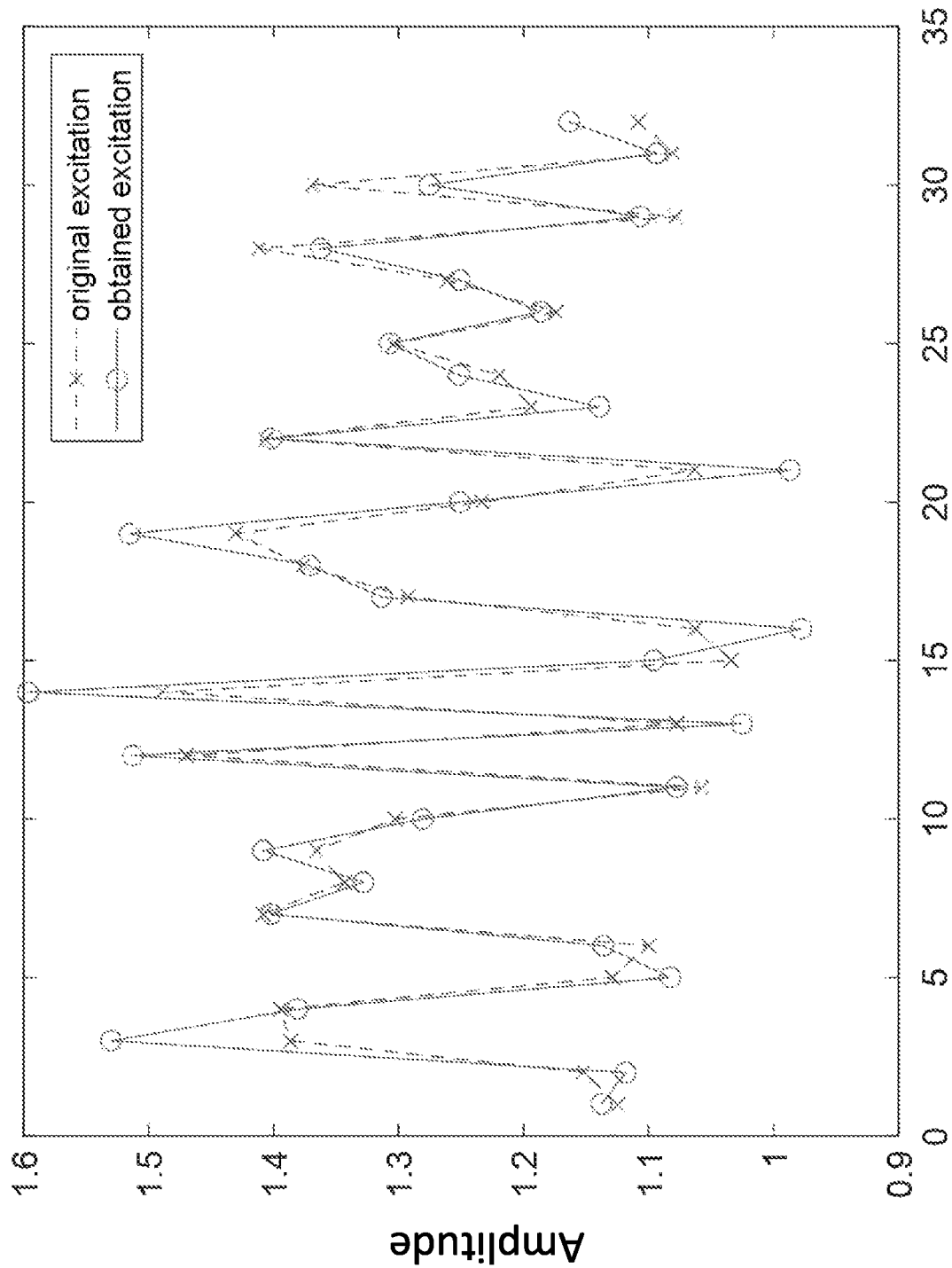
Figure 12:
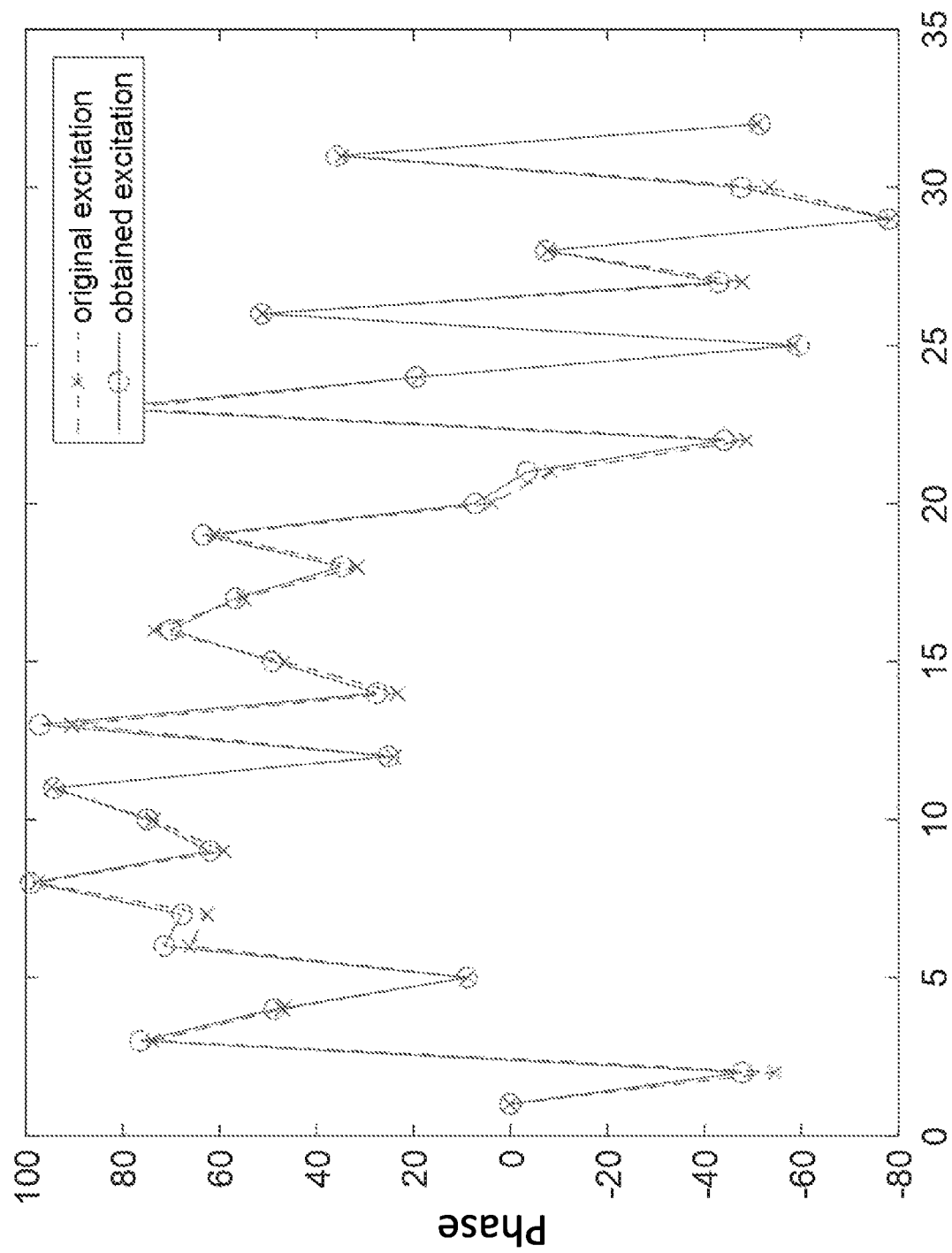

In a second embodiment, the number of the RF units 5 is 32, the number of times of measurement is 96, and a 6-bit digital phase shifter is used. With reference to FIGS. 9 to 12, FIG. 9 shows the solution results of each time of simulation and measurement represented by the amplitude, FIG. 10 shows the number of times of calculating the cost and the iteration where it can be seen that the convergence is completed after about the 30th time, FIG. 11 shows the amplitude information of simulation and measurement for each of the RF units 5, and FIG. 12 shows the phase difference information simulated and measured for each of the RF units 5; seen from FIG. 11 and FIG. 12, the measured amplitude information and the amplitude information of original test may be observed, and the trend of the measured phase difference information and the phase difference information of simulation test tends to be consistent, indicating that the amplitude information and phase difference information of this time are correct results.

Figure 13:
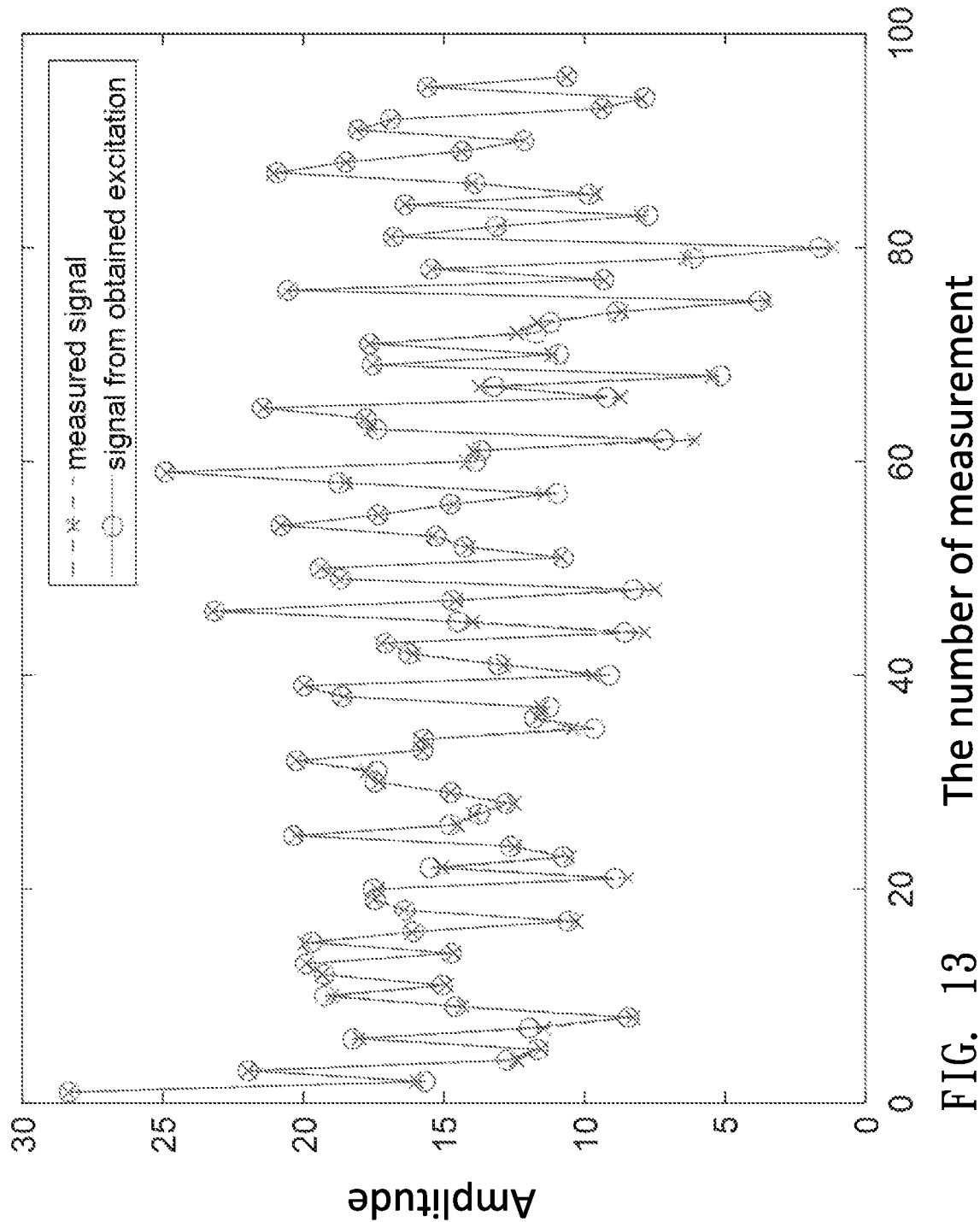
FIGS. 13 to 16 respectively show solution results, iteration convergence, amplitude information, and phase difference information of measurement and simulation according to a third embodiment of the invention.
Figure 14:
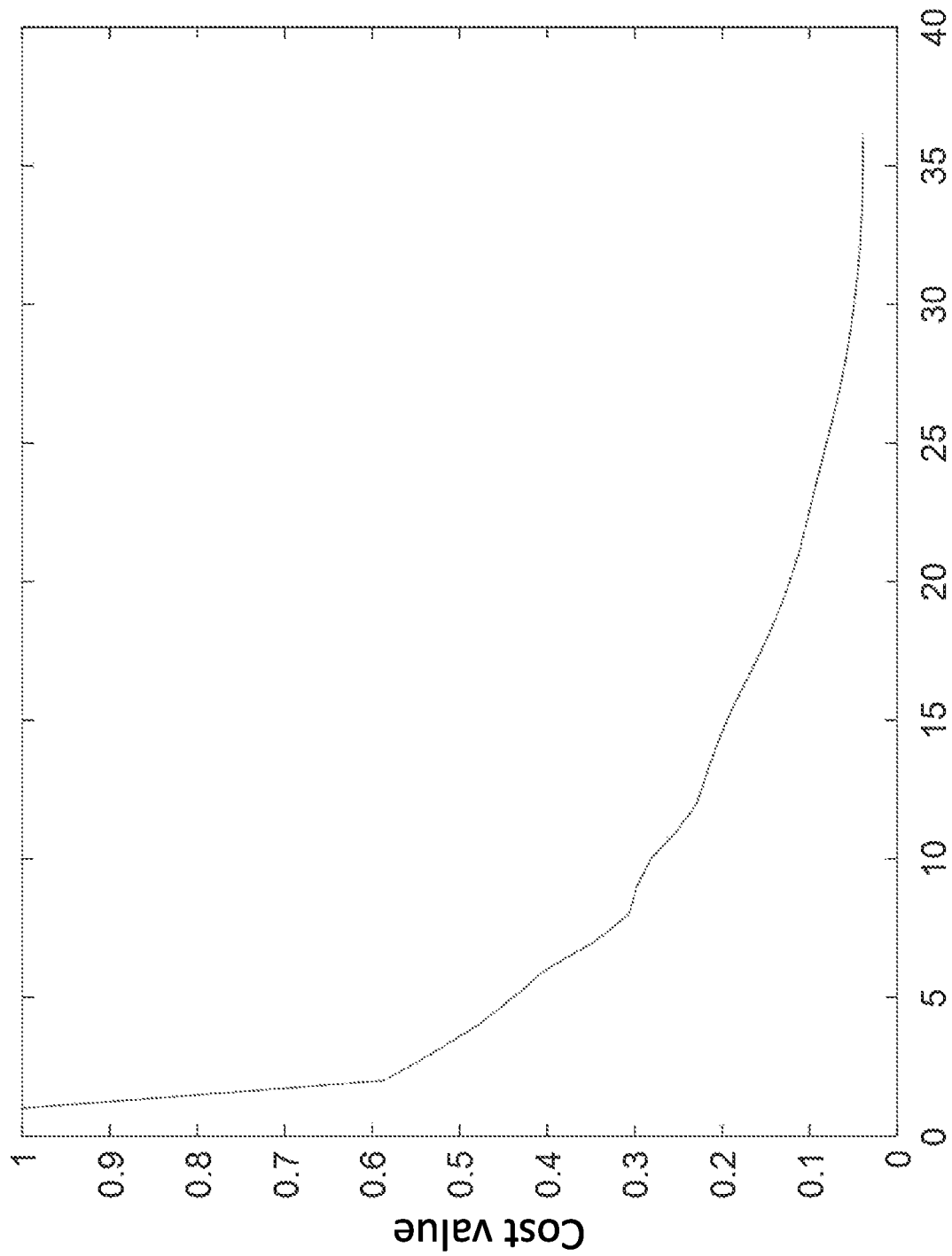
Figure 15:
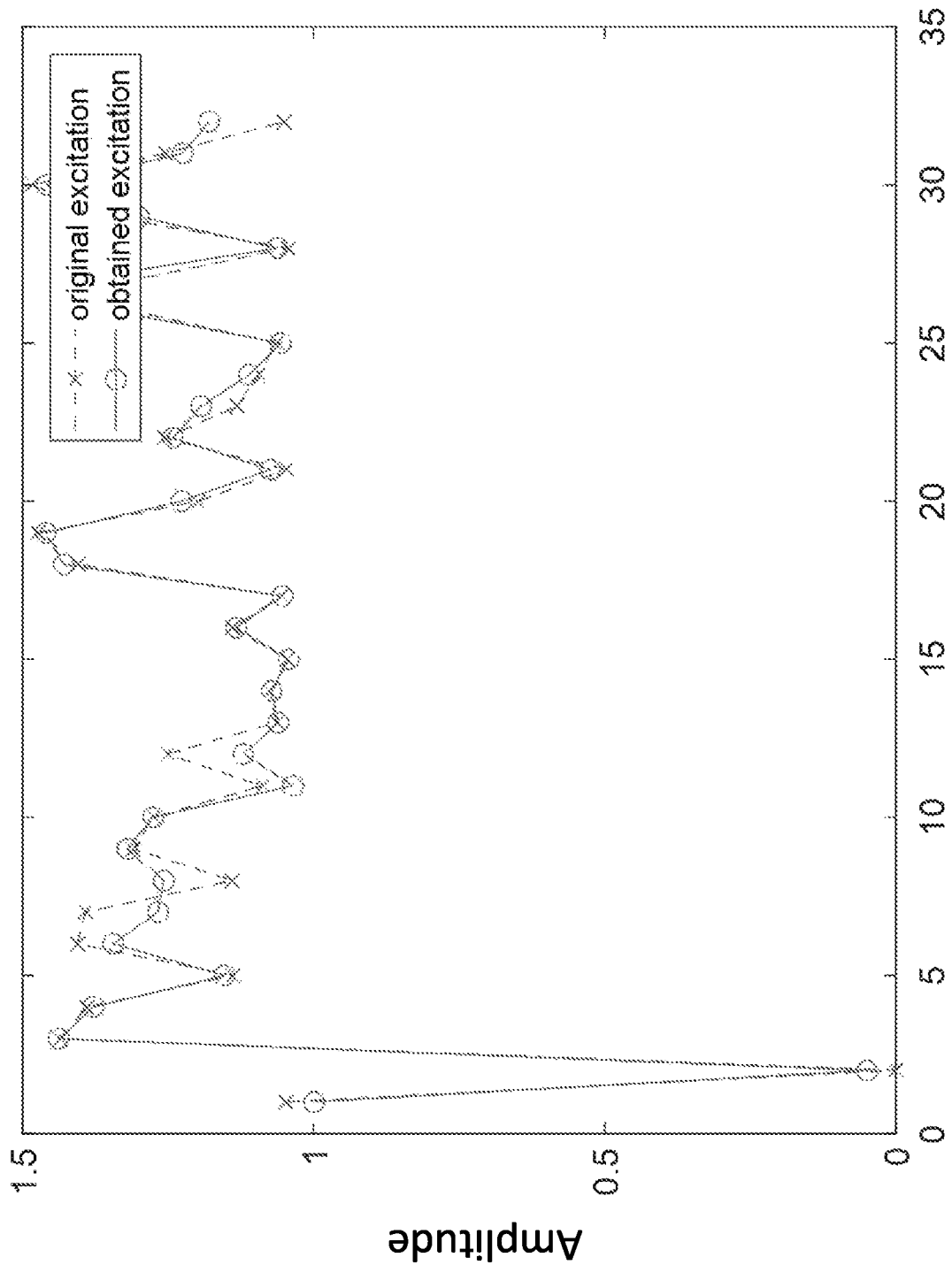
Figure 16:
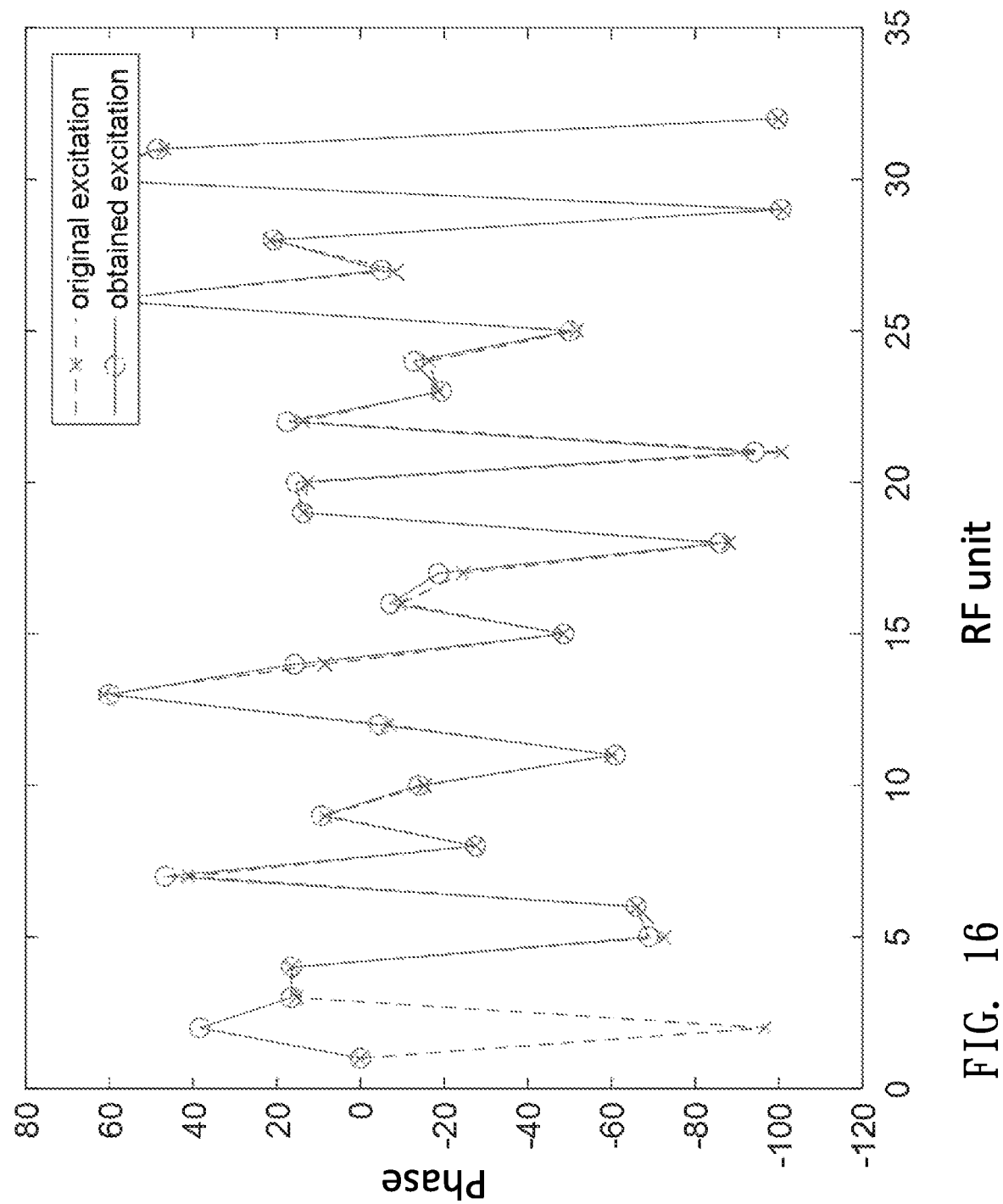
Figure 17:
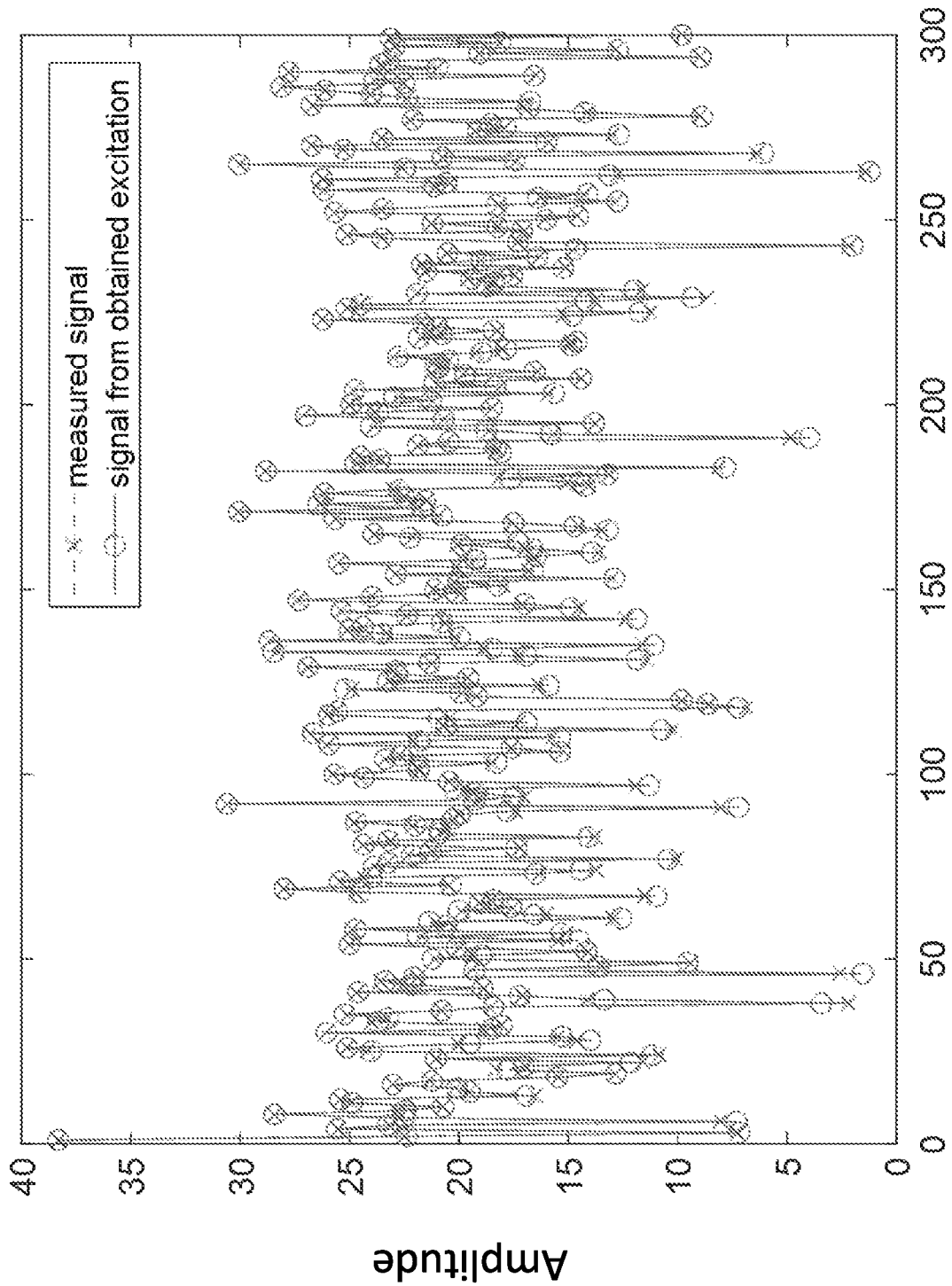
FIGS. 17 to 20 respectively show solution results, iteration convergence, amplitude information, and phase difference information of measurement and simulation according to a fourth embodiment of the invention.

In a third embodiment, the number of the RF units 5 is 32, the number of times of test and measurement is 96, a 6-bit digital phase shifter is used, and a phase error angle of the measurement device 4 is 3 degrees without any noises. With reference to FIGS. 13 to 16, FIG. 13 shows the solution results of each time of simulation and measurement represented by the amplitude, FIG. 13 shows the number of times of calculating the cost and the iteration where it can be seen that the convergence is completed after about the 35th time, FIG. 14 shows the amplitude information of simulation and measurement for each of the RF units 5, and FIG. 15 shows the phase difference information simulated and measured for each of the RF units 5. From FIG. 15 and FIG. 16, most of the measured amplitude information and the amplitude information of original test may be observed, and the trend of the measured phase difference information and the phase difference information simulated tends to be consistent, wherein the amplitude of the second RF unit 5 is close to zero, and the phase difference information is inconsistent with the phase difference information of simulation test, indicating that the second RF unit 5 is damaged.

Figure 18:
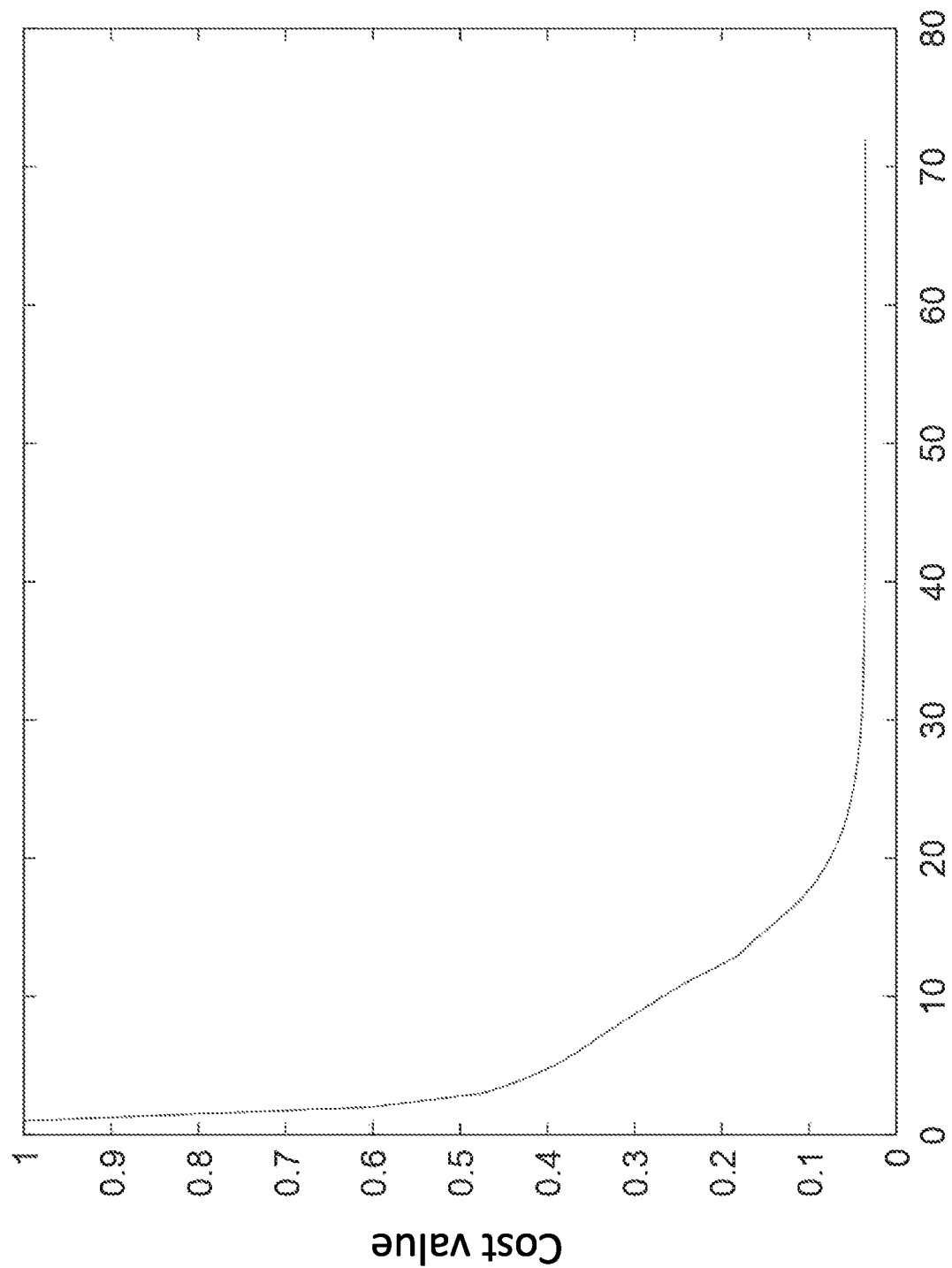
Figure 19:
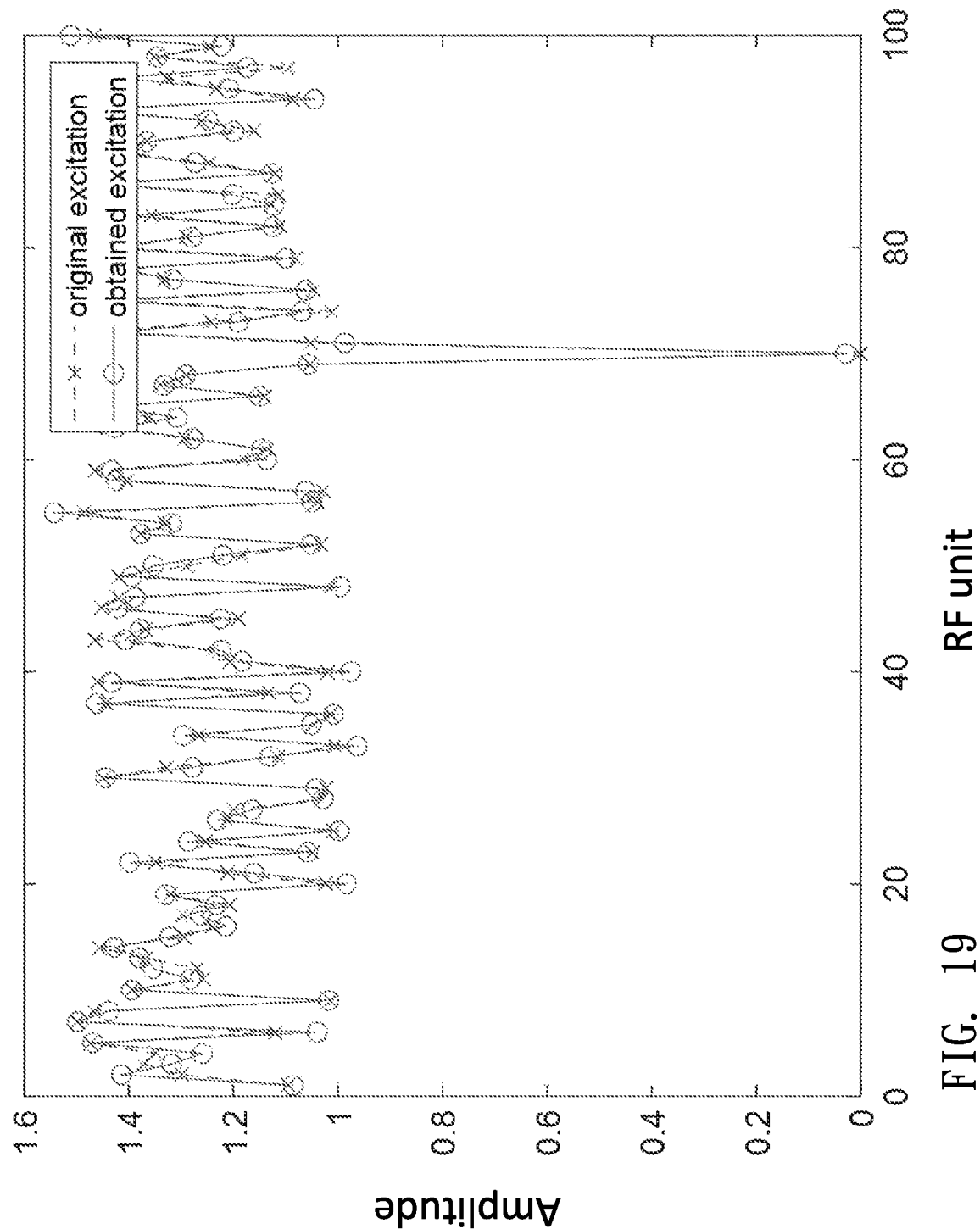
Figure 20:
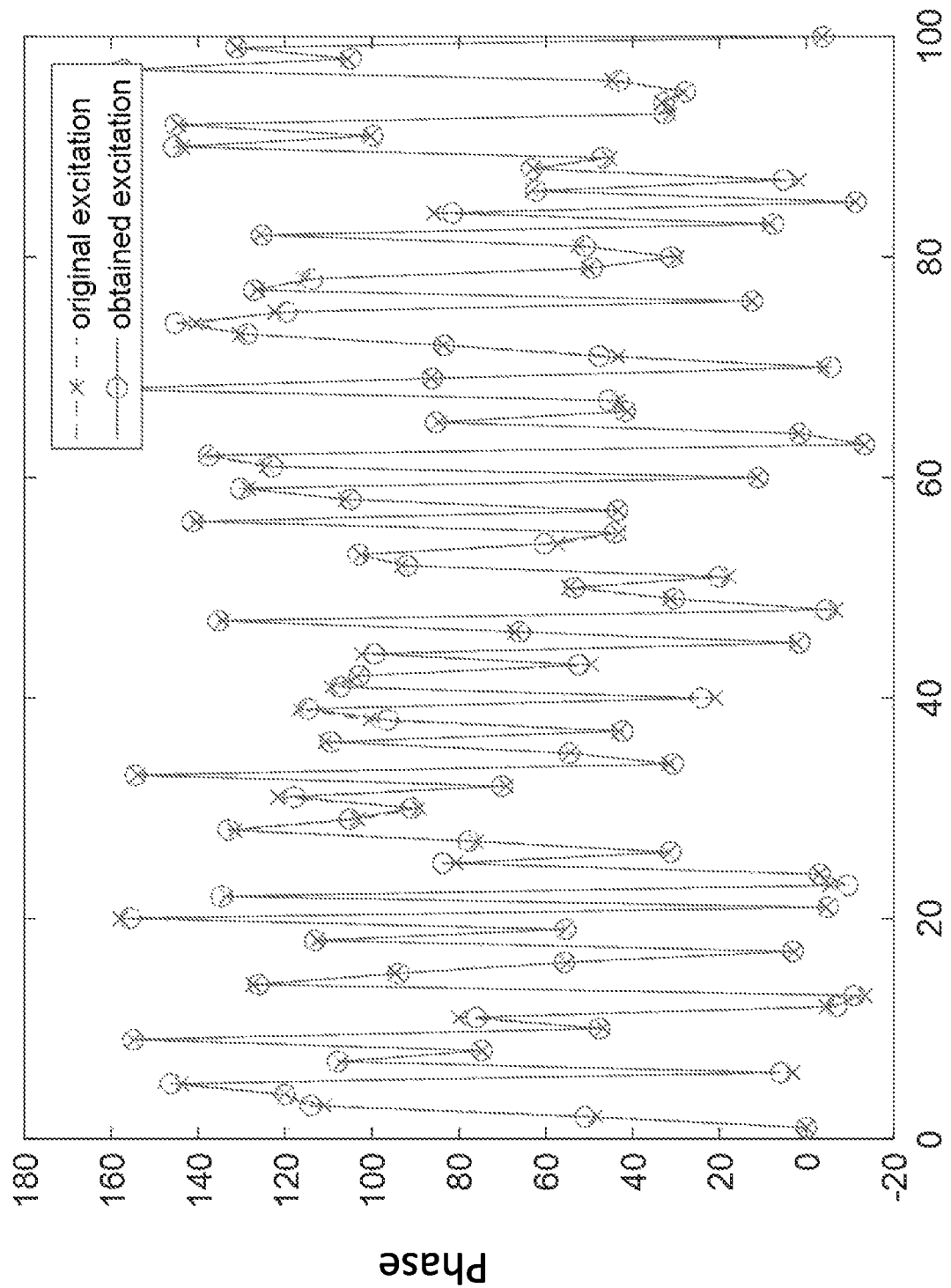
Figure 21:
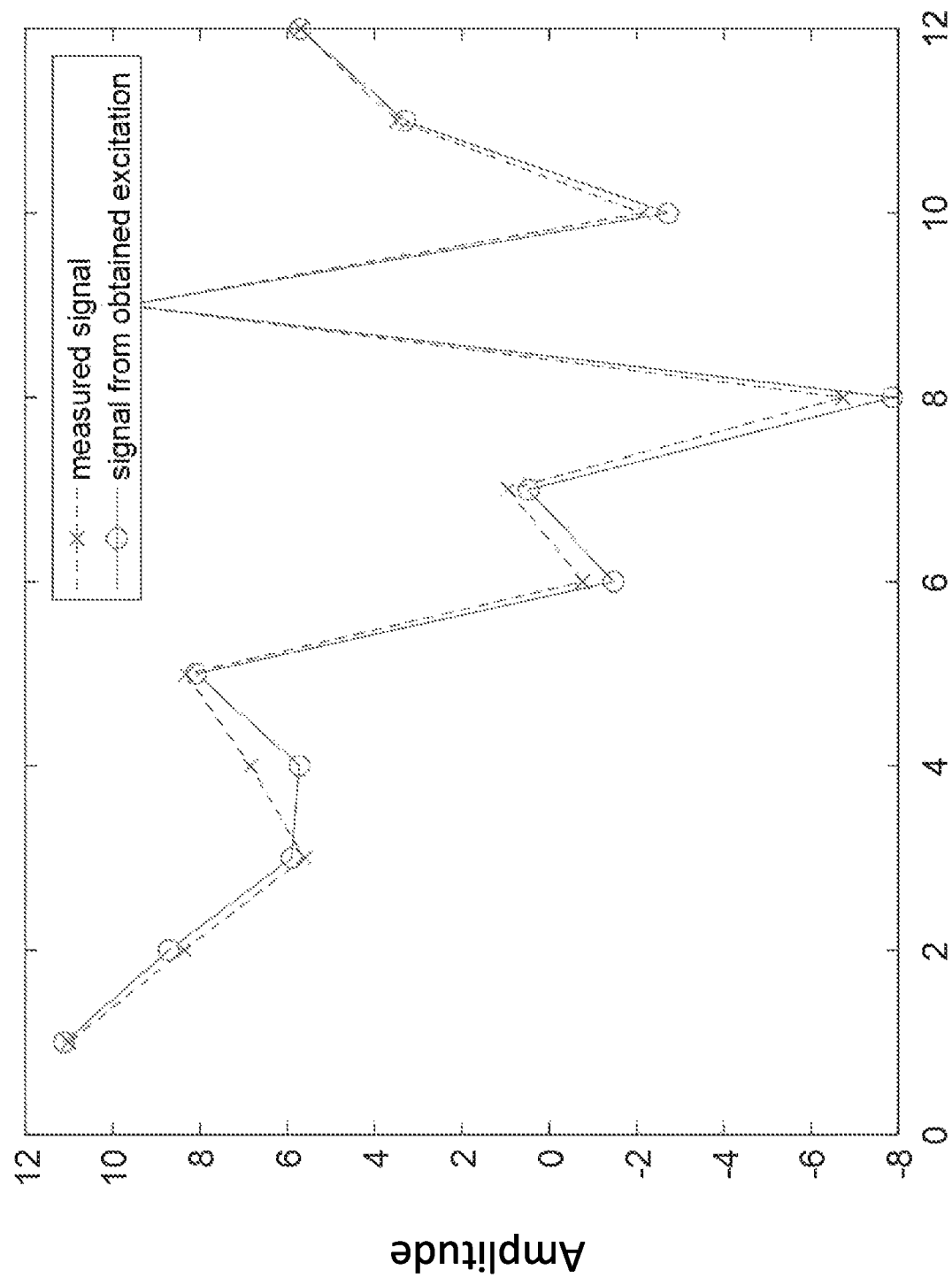
FIGS. 21 to 24 respectively show solution results, iteration convergence, amplitude information, and phase difference information of measurement and simulation according to a fifth embodiment of the invention.

In a fourth embodiment, the number of the RF units 5 is 100, the number of times of measurement is 300, a 3-bit digital phase shifter is used, and a phase error angle of the measurement device 4 is 3 degrees without any noise. With reference to FIGS. 17 to 20, FIG. 17 shows the solution results of each time of simulation and measurement represented by the amplitude, FIG. 18 shows the number of times of calculating the cost and the iteration where it can be seen that the convergence is completed after about the 30th time, FIG. 19 shows the amplitude information of simulation and measurement for each of the RF units 5, and FIG. 20 shows the phase difference information simulated and measured for each of the RF units 5. From FIG. 19 and FIG. 20, most of the measured amplitude information and the amplitude information simulated may be observed, and the trend of the measured phase difference information and the phase difference information simulated tends to be consistent, wherein the amplitude of the seventieth RF unit 5 is close to zero, and the phase difference information is consistent with the phase difference information simulated, indicating that the seventieth RF unit 5 is damaged.

Figure 22:
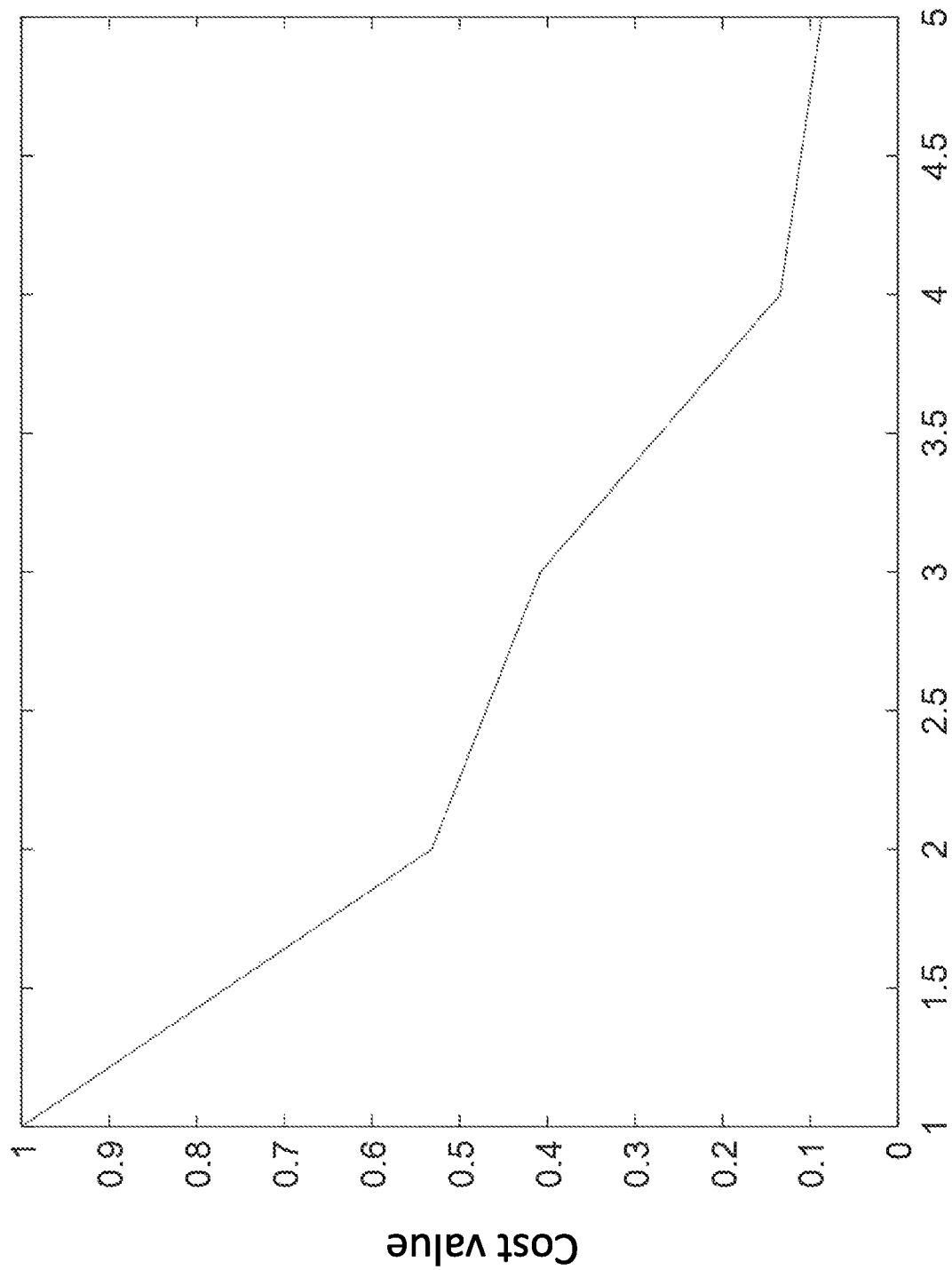
Figure 23:
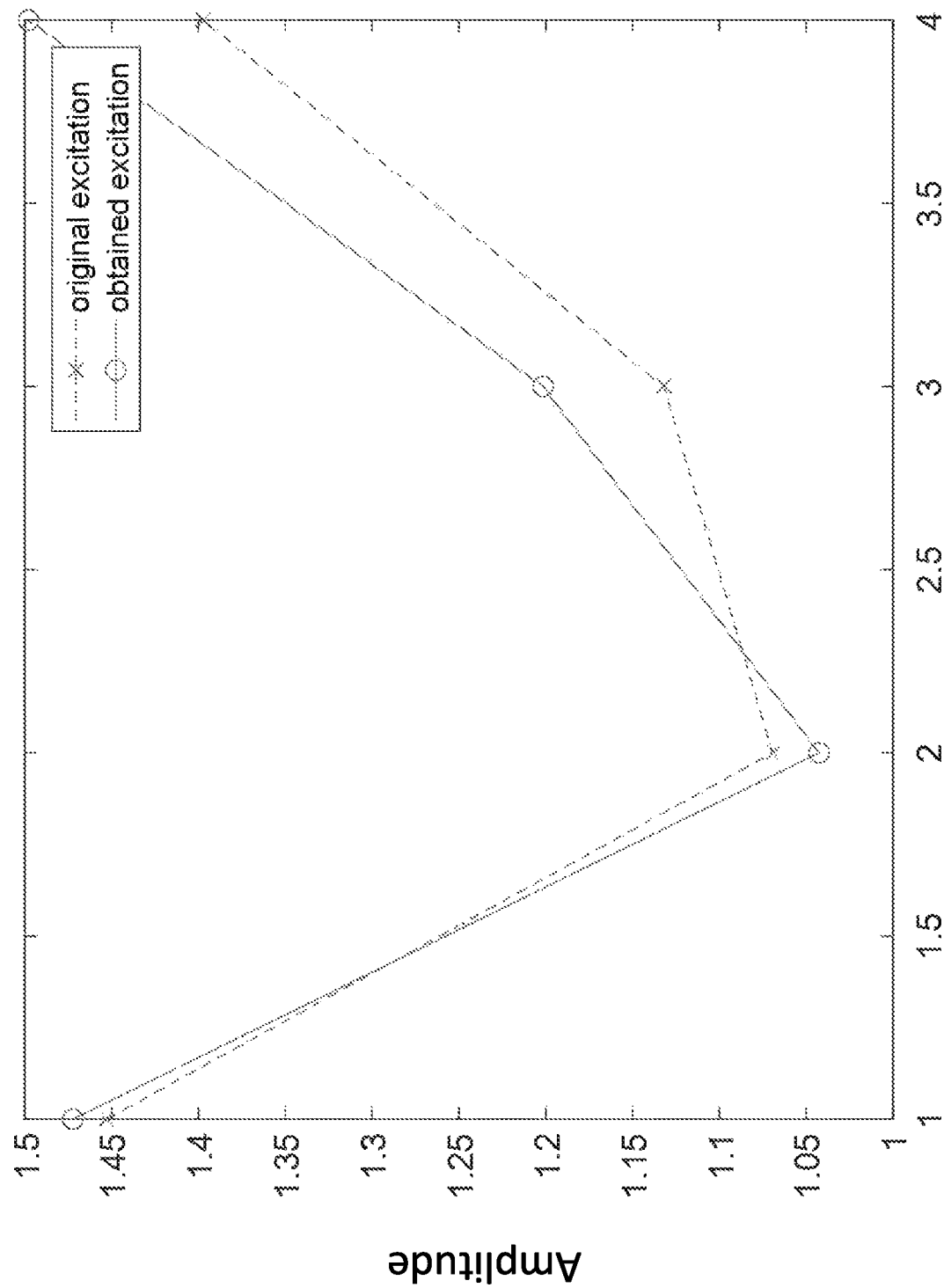
Figure 24:
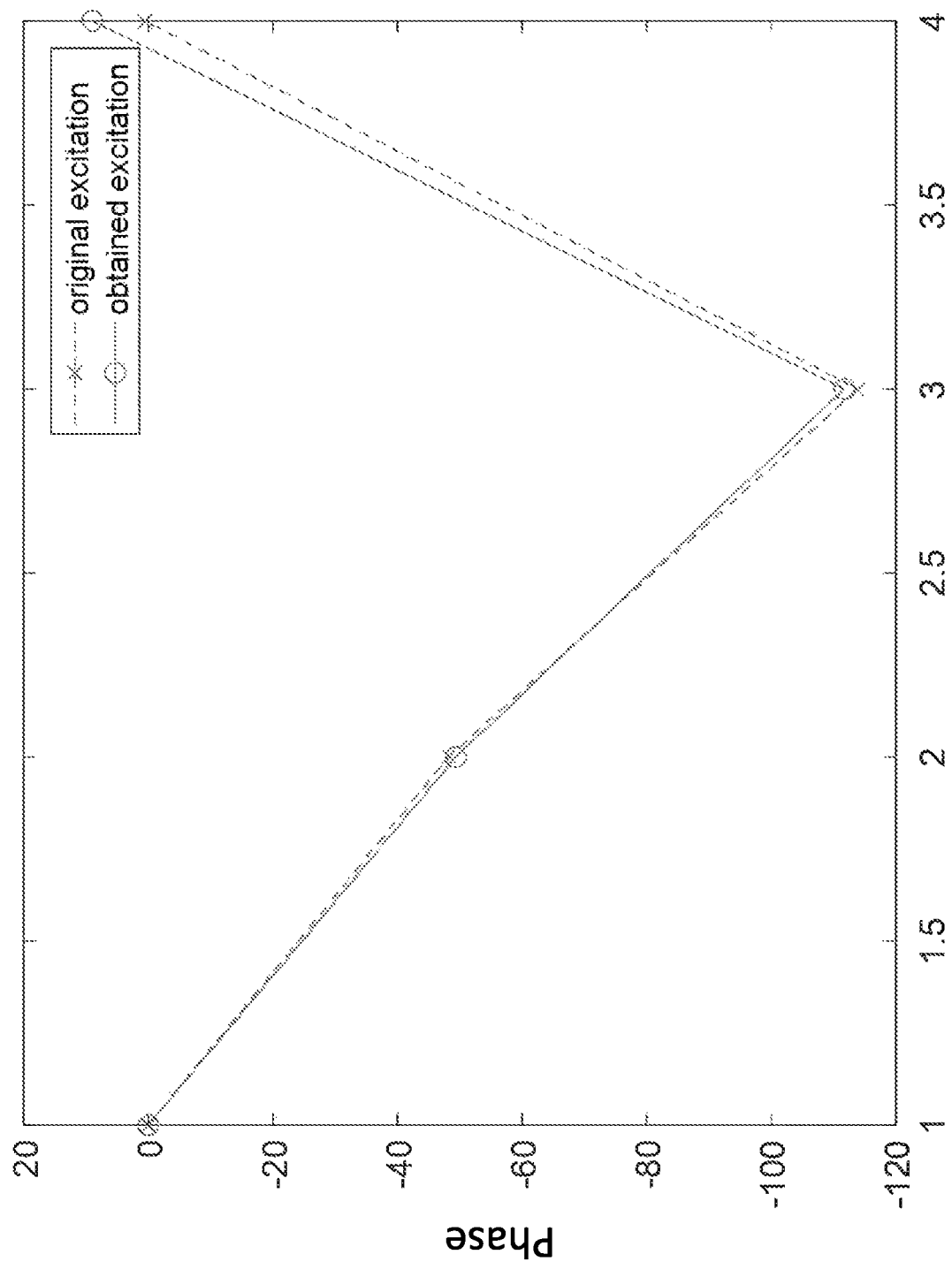

In a fifth embodiment, the number of the RF units 5 is 4, the number of times of measurement is 12, a 6-bit digital phase shifter is used, and a phase error angle of the measurement device 4 is 3 degrees without any noise. With reference to FIGS. 21 to 24, FIG. 21 shows the solution results of each time of simulation and measurement represented by the amplitude, FIG. 22 shows the number of times of calculating the cost and the iteration where it can be seen that the convergence is completed after about the 30th time, FIG. 23 shows the amplitude information of simulation and measurement for each of the antenna elements to be tested 5, and FIG. 24 shows the phase difference information of simulated and measured for each of the antenna elements to be tested 5; seen from FIG. 23 and FIG. 24, the measured amplitude information and the amplitude information of simulated test may be observed, and the trend of the measured phase difference information and the phase difference information simulated tends to be consistent, indicating that the amplitude information and phase difference information of this time are correct results.

In summary, without any phase information, the invention may achieve signal solution through the measurement information and the random microwave signal, and perform iteration and convergence calculation on all of the solution results to obtain the amplitude information and phase difference information of each of the RF units 5 for prepared correction information before the verification of the signals. The number of RF units 5 that may be measured by the invention is not limited; according to the invention, the measured amplitude information or phase difference information may be compared with the amplitude information or phase difference information of original test respectively to screen out the RF units 5 that may be damaged. In addition, requiring no phase information means that the invention only requires a single signal source device 2 to measure multiple antenna elements, antenna array elements, or antenna-in-package, thereby reducing the measurement cost.

The above description is only to illustrate the preferred implementation mode of the invention, and is not intended to limit the scope of implementation. All simple replacements and equivalent changes made according to the patent scope of the invention and the content of the patent specification all belong to the scope of the patent application of the invention.

What is claimed is:

1. A calibration and group measurement system for radio frequency (RF) units, comprising:
   a control device;
   a signal source device, connected with the control device, the signal source device outputting a microwave signal source according to signal source information emitted by the control device;
   a test platform, connected with the control device and the signal source device, the test platform being provided to place N RF units and performing M times of stimulations on the RF units, wherein during each of the stimulations, the test platform transforms the microwave signal source into N random microwave signals, the RF units respectively output the N random microwave signals, and the N random microwave signals are superimposed to form a measurement signal; and
   a measurement device, connected with the control device, wherein the measurement device is configured to receive M times of the measurement signal to generate M pieces of measurement information respectively, and transmit the M pieces of measurement information to the control device;
   wherein the control device is configured to perform signal solution to obtain solution results according to the M times of the M pieces of measurement information and the M times of the N random microwave signals, and perform iterative calculation and convergence calculation on the solution results to obtain amplitude information and phase difference information of the RF units;

wherein the N and the M are positive integers.

2. The system according to claim 1, wherein the test platform comprises:
a signal modulation device, connected with the control device, receiving modulation information emitted by the control device, and emitting N microwave modulation signals according to the modulation information;
a random control device connected with the control device and generating random phase and amplitude information according to a random control signal emitted by the control device;
a radio frequency control device connected with the signal source device and the random control device, receiving the microwave signal source emitted by the signal source device, receiving the random phase and amplitude information, and generating N RF signals with different phases and amplitudes according to the microwave signal source and the random phase and amplitude information; and
N couplers connected with the radio frequency control device and the signal modulation device and respectively integrating the RF signals and the microwave modulation signals into the N random microwave signals with different phases and amplitudes.

3. The system according to claim 1, wherein when the RF units are antenna element or Antenna-in-Package (AiP), each of the measurement information generated by the measurement device is represented by formula (1):

$$g_m = f_m = [R_{mn}][e_n] \qquad (1);$$

wherein $f_m$ represents the measurement information of the m-th time in the M times measurement, $g_m$ represents the amplitude information of the m-th time in the M times measurement, $R_{mn}$ is the random microwave signal of the n-th antenna of the m-th time in the M times measurement, $[R_{mn}]$ is a matrix representation of $R_{mn}$, $e_n$ represents radiation characteristics of a n-th RF unit, and $e_n$ is related to error in measurement orientation, radiation, and RF path, instead of excitation coefficients of the RF units, wherein m is a natural number from 1 to M, and n is a natural number from 1 to N.

4. The system according to claim 3, wherein a relationship between the excitation coefficients and radiation of the RF units of each of the measurement information is represented by formula (2):

$$E_{net}(\bar{r}) = \sum_{n=1}^{N} A_n e^{j\varphi_n} E_n(\bar{r}); \qquad (2)$$

wherein, $E_{net}(\bar{r})$ represents radiation characteristics of each of the RF units superimposed on the position $\bar{r}$, $A_n e^{j\varphi_n}$ represents the random microwave signal of the n-th RF unit in the m-th time, $A_n$ represents an amplitude in the excitation coefficients of the n-th RF unit, $\varphi_n$ represents a phase in the excitation coefficients of the n-th RF unit, $\bar{r}=(r,\theta,\phi)$ represents a measurement direction and distance, and $E_n(\bar{r})$ represents radiated electromagnetic field of the n-th RF unit in an initial state where $((A_n,\varphi_n))=(1,0))$;

when the n-th RF unit has an error or is disabled, $E_n(\bar{r})$ changes correspondingly, and formula (2) is replaced by formula (3):

$$E_{net}(\bar{r}) = \sum_{n=1}^{N} A_n e^{j\varphi_n} \left( A_n^{err} e^{j\Delta\phi_n^{err}} E_n(\bar{r}) \right)$$

wherein $$A_n^{err} e^{j\Delta\phi_n^{err}}$$

represents the error in RF path where the n-th RF unit belongs, and each of the measurements is performed by changing $(A_n,\varphi_n)$ to be $(A_{mn},\varphi_{mn})$.

5. The system according to claim 4, wherein the control device is configured to obtain the solution results based on an iteration and convergence conditions that are pre-defined, successive projection method (SPM) is used in the iteration to obtain a shortest error distance solution of in the form of vertical orthogonal projection for each of the measurement information, and the m-th time of the measurement information is used to solve an u-th projection, as represented by formula (4):

$$\vec{e}_{u+1,m} = \vec{e}_{u,m} + \left( \left| \frac{g_m}{\vec{R}_m \cdot \vec{e}_{u,m}} \right| - 1 \right) \frac{\vec{R}_m \cdot \vec{e}_{u,m}}{\vec{R}_m \cdot \vec{R}_m^*} \vec{R}_m^*; \qquad (4)$$

wherein $\vec{e}$ is a vector representation of $[e_n]$, ($\vec{e}=[e1, e2, \ldots]$), u represents the number of times of iterations, $\vec{e}_{u,m}$ represents a value of the previous iteration, $g_m$ represents an amplitude of measurement information $f_m$; $\vec{R}_m$ is a vector representation of $[R_{mn}]$, and $\vec{R}_m^*$ is a conjugate vector of $\vec{R}_m$; the iteration is performed sequentially with the measurement information of different orders.

6. The system according to claim 5, wherein after each of the iteration is completed, the control device further works out a cost value according to a cost function according to formula (5):

$$\text{cost}(u) = \sum_m \left| \left| \vec{R}_m \cdot \vec{e}_{u,m} \right|^2 - g_m^2 \right|; \qquad (5)$$

wherein cost(u) represents the cost function, u also represents a first number of times in calculation;
a cost difference is calculated based on the cost value currently calculated and the cost value previously calculated; and the cost value currently calculated, the cost difference, and a calculation number of the cost difference or the cost value currently calculated are used as the convergence conditions.

7. The system according to claim 6, wherein the convergence calculation is completed when the cost difference is less than or equal to a default cost difference.

8. The system according to claim 7, wherein the convergence calculation is also completed when the cost difference is greater than the default cost difference, the first number is greater than a first default number of times, and the cost value currently calculated is less than a default cost value.

9. The system according to claim 8, wherein the convergence calculation is also completed when the cost difference is greater than the default cost difference, the first number is greater than the first default number, the cost value currently calculated is greater than the default cost value, and a second number of times in calculation is greater than a second default number.

10. The system according to claim 9, wherein when the first number is less than the first default number or the second number is less than the second default number, new $\vec{e}_{u,m}$ is regiven, the cost value and the cost difference are calculated once again, and whether the convergence calculation is completed is determined once again.

11. The system according to claim 1, wherein the M is greater than the N.

12. A calibration and group measurement method for RF units applied in the calibration and group measurement system according to claim 1 comprises steps of:
 providing a test parameter to the control device, wherein the control device outputs the microwave signal source according to signal source information emitted by the control device;
 controlling the test platform to perform M times of stimulations, wherein the test platform performs the following steps in each of the stimulations:
  transforming the microwave signal source into the N random microwave signals;
  transmitting the N random microwave signals to the RF units and the control device, wherein each of the RF units receives each of the N random microwave signals, respectively; and
  stimulating, by the RF units, the random microwave signals, such that the N random microwave signals are superimposed to form the measurement signal;
 receiving, by the measurement device, the measurement signal of M times of the stimulations to generate the M pieces of measurement information respectively;
 transmitting, by the measurement device, the M pieces of measurement information to the control device;
 performing signal solution, by the control device, the M times of the M pieces of measurement information and the M times of the N random microwave signals to obtain solution results, and performing iterative calculation and convergence calculation on the solution results to obtain the amplitude information and the phase difference information of the RF units.

13. The method according to claim 12, when the RF units are antenna elements or Antenna-in-Package (AiP), each of the measurement information generated by the measurement device is represented by formula (1):

$$g_m = f_m = [R_{mn}][e_n] \tag{1}$$

wherein $f_m$ represents the measurement information of the m-th time in the M times measurement, $g_m$ represents the amplitude information of the m-th time in the M times measurement, $R_{mn}$ is the random microwave signal of the n-th antenna of the m-th time in the M times measurement, $[R_{mn}]$ is a matrix representation of $R_{mn}$, $e_n$ represents radiation characteristics of the n-th RF unit, and $e_n$ is related to an error in measurement orientation, radiation, and RF path, instead of excitation coefficients of the RF units, wherein m is a natural number from 1 to M, and n is a natural number from 1 to N.

14. The method according to claim 13, a relationship between the excitation coefficients and radiation of the RF units of each of the measurement information is represented by formula (2):

$$E_{net}(\bar{r}) = \sum_{n=1}^{N} A_n e^{j\varphi_n} E_n(\bar{r}); \tag{2}$$

wherein, $E_{net}(\bar{r})$ represents radiation characteristics of each of the RF units superimposed on the position $\bar{r}$, $A_n e^{j\varphi_n}$ represents the random microwave signal of the n-th RF unit in the m-th time, $A_n$ represents an amplitude in the excitation coefficients of the n-th RF unit, $\varphi_n$ represents a phase in the excitation coefficients of the n-th RF unit, $\hat{r}=(r,\theta,\phi)$ represents measurement direction and distance, and $E_n(\bar{r})$ represents radiated electromagnetic field of the n-th RF unit in an initial state where $((A_n,\varphi_n)=(1,0))$;

when the n-th RF unit has an error or is disabled, $E_n(\bar{r})$ changes correspondingly, and formula (2) is replaced by formula (3):

$$E_{net}(\bar{r}) = \sum_{n=1}^{N} A_n e^{j\varphi_n} \left( A_n^{err} e^{j\Delta\phi_n^{err}} E_n(\bar{r}) \right); \tag{3}$$

wherein $$A_n^{err} e^{j\Delta\phi_n^{err}}$$

represents the error in RF path where the n-th RF unit belongs, and each of the measurements are performed by changing $(A_n,\varphi_n)$ to be $(A_{mn},\varphi_{mn})$.

15. The method according to claim 14, wherein in the step of performing signal solution, the solution results are obtained based on an iteration and convergence conditions that are pre-defined, successive projection method (SPM) is used in the iteration to obtain a shortest error distance solution the form of vertical orthogonal projection for each of the measurement information, and the m-th time of the measurement information is used to solve the u-th projection, as represented by formula (4):

$$\vec{e}_{u+1,m} = \vec{e}_{u,m} + \left( \left| \frac{g_m}{\vec{R}_m \cdot \vec{e}_{u,m}} \right| - 1 \right) \frac{\vec{R}_m \cdot \vec{e}_{u,m}}{\vec{R}_m \cdot \vec{R}_m^*} \vec{R}_m^*; \tag{4}$$

wherein $\vec{e}$ is a vector representation of $[e_n]$, ($\vec{e}$ =[e1, e2, . . . ]), u represents the number of times of iterations, $\vec{e}_{u,m}$ represents a value of the previous iteration, $g_m$ represents an amplitude of measurement information $f_m$; $\vec{R}_m$ is a vector representation of $[R_{mn}]$, and $\vec{R}_m^*$ is a conjugate vector of $\vec{R}_m$; the iteration is performed sequentially with the measurement information of different orders.

16. The method according to claim 15, in the step of performing iterative calculation and convergence calculation, further comprising:
 A. calculating a cost value according to a cost function by using the solution results;

B. calculating a cost difference of the cost values of the solution results for two consecutive times;

C. determining whether the cost difference is less than or equal to a default cost difference, the default cost difference being a part of the test parameter configured by the control device; and D. indicating completion of the convergence calculation when the cost difference is less than or equal to the default cost difference.

17. The method according to claim 16, wherein when the cost difference is greater than the calculation cost difference, the method performs the steps of:

E. determining whether a first number of times in calculation is less than a first default number of times, wherein the first number of times in calculation the number of times of is a number of accumulating the cost difference, the first default number of times is a part of the test parameter configured by the control device, and the first default number of times is a positive integer;

F. regiving a new initial guess value $\vec{e}_{u,m}$ and then handling according to step A and the step B when the first number of times in calculation is less than the first default number of times;

G. determining whether the cost value currently calculated is less than a default cost value again when the first number of times in calculation is greater than the first default number of times, the default cost value being a part of the test parameter configured by the control device, the default cost value is a positive number;

H. indicating the completion of convergence calculation when the first number is greater than the first default number and the cost value currently calculated is less the default cost value;

I. determining whether a second number of times in calculation is greater than a second default number of times again when the first number is greater than the first default number and the cost value is greater than the default cost value, wherein the second number of times in calculation is the number of times of regiving the new initial guess value $\vec{e}_{u,m}$ accumulatively, the second default number of times is a part of the test parameter configured by the control device, and the second default number of times is a positive integer;

J. indicating completion of convergence calculation when the second number of times in calculation is greater than the second default number of times;

K. regiving a new initial guess value $\vec{e}_{u,m}$ and then handling according to the step A and the step B when the second number of times in calculation is less than the second default number of times.

18. The method according to claim 17, wherein after each of the iteration calculation is completed, working out, by the control device, the cost value with the cost function according to formula (5):

$$\text{cost }(u) = \sum_{m}\left|\left|\vec{R}_m \cdot \vec{e}_{u,m}\right|^2 - g_m^2\right|; \quad (5)$$

wherein cost(u) represents the cost function, u also represent the first number;

a cost difference is calculated based on the cost value currently calculated and the cost value previously calculated; and the cost value currently calculated, the cost difference, and a calculation number of the cost difference or the cost value currently calculated are used as the convergence conditions.

* * * * *